US010971620B2

(12) United States Patent
Weyers et al.

(10) Patent No.: US 10,971,620 B2
(45) Date of Patent: Apr. 6, 2021

(54) METHOD FOR PRODUCING A SEMICONDUCTOR ARRANGEMENT

(71) Applicant: Infineon Technologies Dresden GmbH & Co. KG, Dresden (DE)

(72) Inventors: Joachim Weyers, Hoehenkirchen (DE); Andreas Boehm, Neubiberg (DE); Anton Mauder, Kolbermoor (DE); Patrick Schindler, Munich (DE); Stefan Tegen, Dresden (DE); Armin Tilke, Dresden (DE); Uwe Wahl, Munich (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/447,207

(22) Filed: Jun. 20, 2019

(65) Prior Publication Data

US 2019/0393334 A1 Dec. 26, 2019

(30) Foreign Application Priority Data

Jun. 26, 2018 (DE) .................. 102018115326.0

(51) Int. Cl.
*H01L 29/78* (2006.01)
*G01K 7/01* (2006.01)
*H01L 23/34* (2006.01)

(52) U.S. Cl.
CPC .......... *H01L 29/7804* (2013.01); *G01K 7/015* (2013.01); *H01L 23/34* (2013.01)

(58) Field of Classification Search
CPC ............ H01L 29/7804; H01L 29/7811; H01L 29/7395; H01L 29/0692; H01L 29/0634; H01L 29/7803; H01L 23/34; H01L 23/36; G01K 7/015
See application file for complete search history.

(56) References Cited

U.S. PATENT DOCUMENTS

| 6,460,411 | B1 * | 10/2002 | Kersjes | ................ G01F 1/6845 |
| | | | | 73/204.26 |
| 6,511,915 | B2 * | 1/2003 | Mlcak | ................ H01L 21/3063 |
| | | | | 257/E21.216 |
| 6,605,487 | B2 * | 8/2003 | Franosch | ............ B81C 1/00047 |
| | | | | 438/50 |
| 2012/0300594 | A1 * | 11/2012 | Ogura | ...................... B06B 1/02 |
| | | | | 367/181 |
| 2013/0050166 | A1 | 2/2013 | Hong et al. | |

(Continued)

FOREIGN PATENT DOCUMENTS

DE 102016104968 B3 7/2017

*Primary Examiner* — Sitaramarao S Yechuri
(74) *Attorney, Agent, or Firm* — Murphy, Bilak & Homiller, PLLC

(57) ABSTRACT

A method includes partly removing a supporting layer arranged between a first semiconductor layer and a second semiconductor layer using an etching process to form at least one undercut between the first semiconductor layer and the second semiconductor layer, at least partly filling the at least one undercut with a first material having a higher thermal conductivity than the supporting layer, and forming a sensor device in or on the second semiconductor layer. Semiconductor arrangements and devices produced by the method are also described.

38 Claims, 12 Drawing Sheets

(56) References Cited

U.S. PATENT DOCUMENTS

| | | | | |
|---|---|---|---|---|
| 2015/0375999 A1* | 12/2015 | Kautzsch | ............... | G01L 9/0073 |
| | | | | 257/254 |
| 2016/0322491 A1* | 11/2016 | Hirler | ................. | H01L 29/0882 |
| 2020/0049539 A1* | 2/2020 | De Luca | ................ | G01L 9/0054 |
| 2020/0144209 A1* | 5/2020 | Aketa | .................... | H01L 23/147 |

* cited by examiner

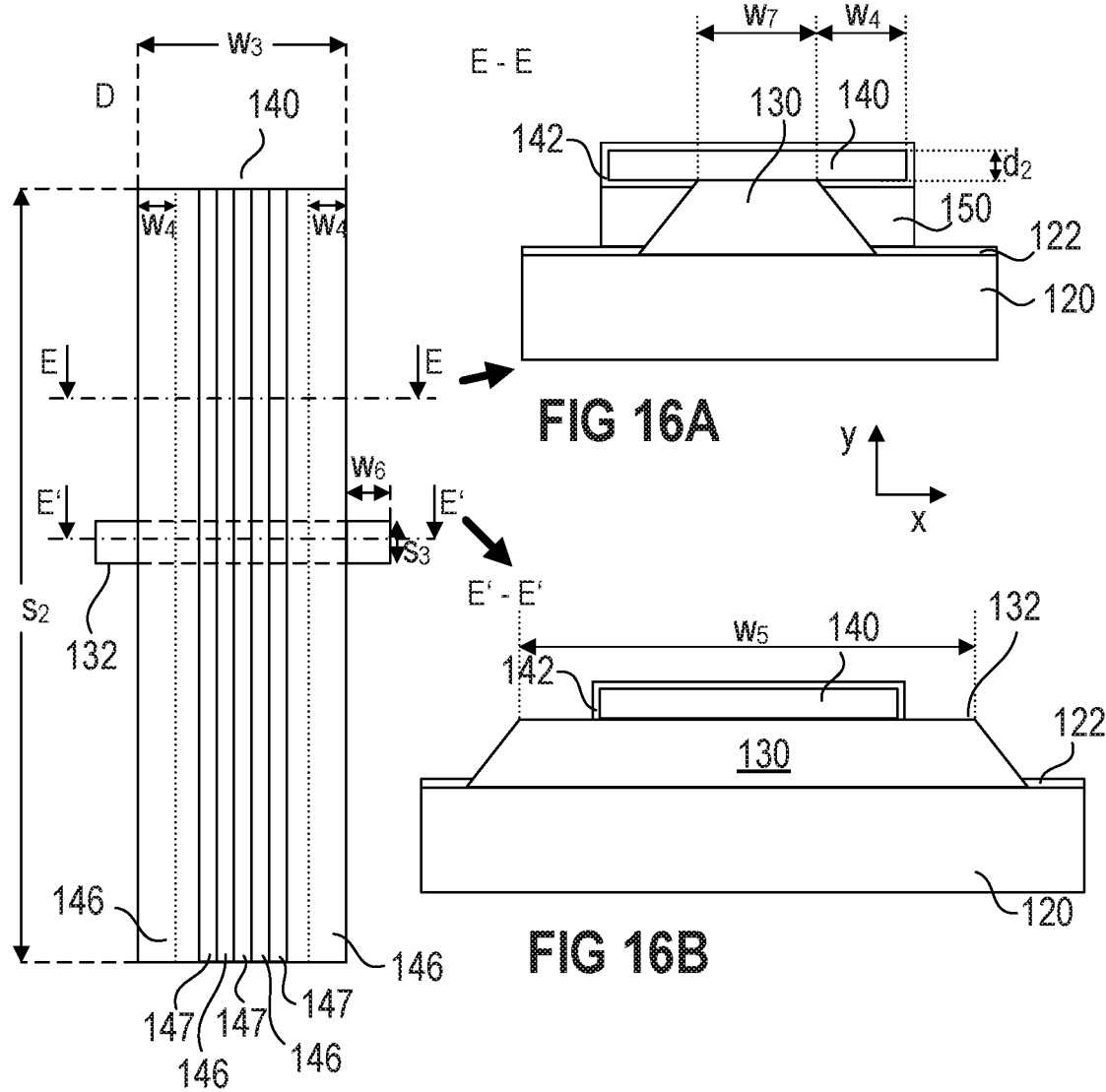

METHOD FOR PRODUCING A SEMICONDUCTOR ARRANGEMENT

TECHNICAL FIELD

The instant disclosure relates to a method for producing a semiconductor arrangement, in particular a semiconductor arrangement including a sensor device.

BACKGROUND

Semiconductor devices such as insulated gate power transistor devices, e.g., power MOSFETs (Metal Oxide Semiconductor Field-Effect Transistors) or IGBTs (Insulated Gate Bipolar Transistors), are widely used as electronic switches in various types of electronic applications. In many applications the reliability of such semiconductor devices is a critical aspect. For example, semiconductor devices that are used in automotive applications have to meet requirements with regard to specified ASIL (automotive safety integrity level) classifications, in accordance with international functional safety standards.

In some applications, destructive junction temperatures may be generated inside the semiconductor device during high SOA (safe operating area) switching, ringing or short-circuit events. Furthermore, the packaging volumes of semiconductor devices are being more and more reduced. Therefore, temperature monitoring has become imperative to protecting semiconductor devices from overheating. It is usually crucial that a sensor provide accurate temperature measurements and have a fast reaction time.

It is desirable to provide a temperature sensor and a method for producing a temperature sensor that has a fast reaction time while providing reliable measurement results.

SUMMARY

One example relates to a method. The method includes partly removing a supporting layer arranged between a first semiconductor layer and a second semiconductor layer using an etching process, thereby forming at least one undercut between the first semiconductor layer and the second semiconductor layer, at least partly filling the at least one undercut with a first material having a higher thermal conductivity than the supporting layer, and forming a sensor device in or on the second semiconductor layer.

Another example relates to a semiconductor arrangement. The semiconductor arrangement includes a supporting layer that is arranged between a first semiconductor layer and a second semiconductor layer, wherein the supporting layer has a first thermal conductivity. The semiconductor arrangement further includes at least one first region formed of a first material, wherein the at least one first region is formed between the first semiconductor layer and the second semiconductor layer and adjacent to the supporting layer, and wherein the first material has a second thermal conductivity that is higher than the first thermal conductivity. The semiconductor arrangement further includes a sensor device that is formed in or on the second semiconductor layer.

Another example relates to a semiconductor device including a semiconductor body comprising a first semiconductor layer, and a transistor device including at least one gate electrode and a plurality of transistor cells, each of the transistor cells including a source region, a body region, and a compensation region formed in the first semiconductor layer. The body region extends from a first surface of the first semiconductor layer into the first semiconductor layer and is dielectrically insulated from the at least one gate electrode by a gate dielectric. The compensation region adjoins the body region and extends from the body region into the first semiconductor layer. The transistor device is arranged in a first section of the semiconductor body, the first section forming an active region. The semiconductor device further includes a second semiconductor layer arranged on the active region and/or a passive region of the semiconductor body, and a sensor device that is formed in or on the second semiconductor layer.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

FIG. 15 schematically illustrates a top view of a section of the semiconductor arrangement of FIG. 8 according to another example.

FIGS. 16A and 16B schematically illustrate cross sectional views of different sections of the semiconductor arrangement of FIG. 15.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
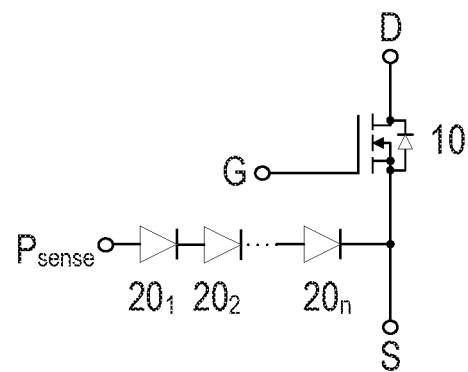
FIG. 1 shows an equivalent circuit diagram of a transistor device and a sensor device.

FIG. 1 schematically illustrates an equivalent circuit diagram of a transistor device 10. The transistor device 10 comprises a drain node D and a source node S with a load path formed between the drain node D and the source node S. The transistor device 10 further comprises a gate node G. A sensor device 20 is coupled between the source node S of the transistor device 10 and a sense node $P_{sense}$. In the example of FIG. 1, the sensor device 20 comprises a plurality of diodes $20_1$, $20_2$, . . . , $20_n$ coupled in series between the source node S of the transistor device 10 and the sense node $P_{sense}$. The sensor device 20 is configured to detect a temperature of the transistor device 10. For example, the sensor device 20 may be coupled to a detection unit (not illustrated). If a temperature of the transistor device 10 during a switching operation of the transistor device 10 increases and crosses a certain threshold, such a detection unit may generate a signal which causes the transistor device 10 to perform the switching operation at a lower switching frequency or to turn into an off-state, for example. In this way, the temperature of the transistor device 10 may be reduced. For example, once the temperature of the transistor device 10 falls below the threshold, the transistor device may resume its normal switching operation.

Figure 2:
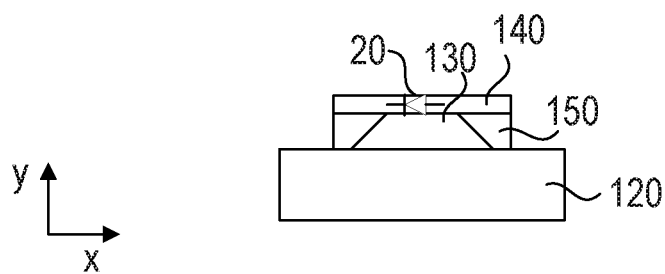
FIG. 2 schematically illustrates a cross sectional view of a semiconductor arrangement.

Now referring to FIG. 2, a cross-sectional view of an exemplary semiconductor arrangement is schematically illustrated. The semiconductor arrangement comprises a first semiconductor layer 120 and a second semiconductor layer 140. A supporting layer 130 is arranged between the first semiconductor layer 120 and the second semiconductor layer 140. The supporting layer 130 may have a first thermal conductivity $\lambda_1$. At least one region of a first material 150 is formed between the first semiconductor layer 120 and the second semiconductor layer 140. The at least one region of the first material 150 is formed adjacent to the supporting layer 130 and has a second thermal conductivity $\lambda_2$ that is higher than the first thermal conductivity $\lambda_1$ of the supporting layer 130. According to one example, $\lambda_2=90*\lambda_1$. A sensor device 20 is formed in the second semiconductor layer 140. As the thermal conductivity $\lambda_2$ of the first material 150 is higher than the thermal conductivity $\lambda_1$ of the supporting layer 130, heat that is generated in the first semiconductor layer 120 is transferred from the first semiconductor layer 120 to the second semiconductor layer 140 mainly via the first material 150. That is, the second semiconductor layer 140 is heated by the first semiconductor layer 120 mainly via the first material 150. Depending on the thickness of the first material 150 (distance between the first semiconductor layer 120 and the second semiconductor layer 140) and the thermal conductivity $\lambda_2$ of the first material 150, the temperature of the second semiconductor layer 140 may be essentially the same as the temperature of the first semiconductor layer 120. The temperature that is detected by the temperature sensor 20 in or on the second semiconductor layer 140, therefore, is an indication of the temperature in the first semiconductor layer 120. In accordance with the example illustrated in FIG. 1, the sensor device 20 illustrated in FIG. 2 may comprise a diode.

While the sensor device 20 in the example of FIG. 2 is illustrated in the second semiconductor layer 140, it is also possible to arrange a sensor device 20 on the second semiconductor layer 140. For example, one or more layers (e.g., metal layers) may be arranged on the second semiconductor layer 140 to form the sensor device 20, wherein the second semiconductor layer 140 is arranged between the sensor device 20 and the first material 150.

Figure 3:
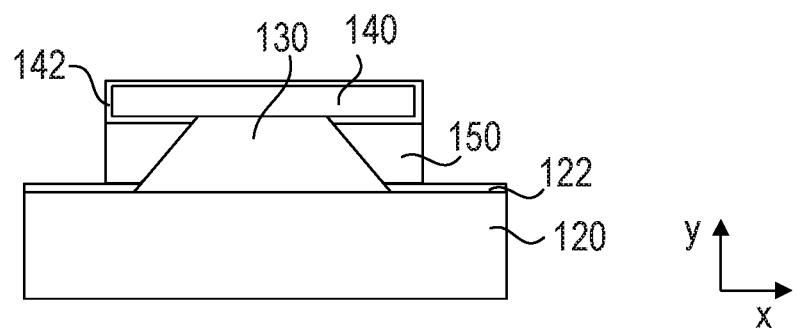
FIG. 3 schematically illustrates a cross sectional view of another semiconductor arrangement.

Now referring to FIG. 3, a cross-sectional view of another exemplary semiconductor arrangement is schematically illustrated. The general structure of the semiconductor arrangement is similar to the structure as has been explained above with respect to FIG. 2. That is, a supporting layer 130 and at least one first region formed of a first material 150 are arranged between a first semiconductor layer 120 and a second semiconductor layer 140. However, the semiconductor arrangement illustrated in FIG. 3 further comprises a first insulation layer 122 arranged between the first semiconductor layer 120 and the first material 150. The semiconductor arrangement may further comprise a second insulation layer 142. In one section, e.g. a first section of a lower surface (a surface facing the supporting layer 130) of the second semiconductor layer 140, the second semiconductor layer 140 directly adjoins the supporting layer 130 with no insulation layer arranged between the supporting layer 130 and the second semiconductor layer 140. Other sections of the second semiconductor layer 140, e.g. second sections of the lower surface, side surfaces and a top surface of the semiconductor layer 140, do not adjoin the supporting layer 130. Such sections of the second semiconductor layer 140 not adjoining the supporting layer 130 may be at least partly covered by a second insulation layer 142. For example, the second insulation layer 142 may be arranged on side surfaces and a top surface of the second semiconductor layer 140. Alternatively or additionally, the second insulation layer 142 may be arranged between the first material 150 and the second semiconductor layer 140, e.g. on second sections of the lower surface of the second semiconductor layer 140.

The first insulation layer 122 may be configured to electrically isolate the first material 150 from the first semiconductor layer 120. The second insulation layer 142 may be configured to electrically isolate the first material 150 from the second semiconductor layer 140. A method for forming the semiconductor arrangement with a first and second insulation layer 122, 142 will be described with respect to FIGS. 11A through 11G below.

Figure 4:
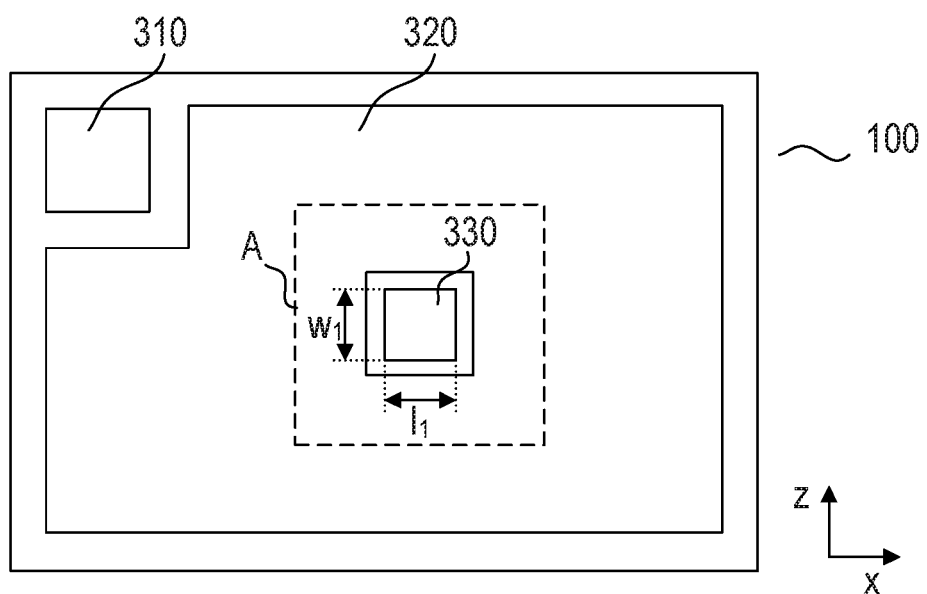
FIG. 4 schematically illustrates a top view of a semiconductor body.

Now referring to FIG. 4, a top view of a semiconductor body 100 is schematically illustrated. The semiconductor body 100 may include a transistor device (not specifically illustrated in FIG. 4). A gate pad 310 and a source pad 320 may be arranged on a top surface of the semiconductor body 100. The gate pad 310 and the source pad 320 allow to electrically contact a gate electrode (not illustrated in FIG. 4) and a source electrode (not illustrated in FIG. 4) of the transistor device. Further, a sensor pad 330 is arranged on the top surface of the semiconductor body 100. In the example illustrated in FIG. 4, the sensor pad 330 is arranged in a central area of the semiconductor body 100 and is surrounded by the source pad 320 in horizontal directions x, z. The gate pad 310 is arranged in one corner of the semiconductor body 100. Such an arrangement, however, is only an example. The gate pad 310 may have any other suitable shape and may be arranged at any other suitable position on the semiconductor body 100. The gate pad 310 may be arranged in a central area of the semiconductor body 100 and may be surrounded by the source pad 320 in horizontal directions x, z, for example. Generally speaking, the gate pad 310 may be completely or only partly surrounded by the source pad 320. The sensor pad 330, instead of in a central area of the semiconductor body 100, may also be arranged closer to one of the edges of the semiconductor body 100, for example. The sensor pad 330 may be completely or only partly surrounded by the source pad 320. The sensor pad 320 may have a rectangular or square shape, for example. Other shapes, however, are also possible. The sensor pad 330 may have a width $w_1$ and a length $l_1$ of, e.g., between 30 µm and 1 mm, or 300 µm and 400 µm, in the horizontal directions x, z. The surface area of the sensor pad 330 may be large enough to allow for a bonding connection with a bonding wire, for example. In a vertical direction y of the semiconductor body 100, the sensor pad 330 may have a thickness $d_1$ of, e.g., 0.5 µm to 1 µm, or 1 µm to 5 µm (see, e.g., FIG. 6).

The source pad 320 and the sensor pad 330 may comprise an electrically conductive material such as a metal, for example. E.g., the source pad 320 and the sensor pad 330 may comprise at least one of Al, Cu, W, Ti, Ni, Sn, Au, Ag, Pt, Pd, and an alloy of one or more of these metals. The thickness of the metal of the sensor pad 330 may be in the range of, e.g., 0.5 µm to 1 µm, or 1 µm to 5 µm (see, e.g., FIG. 6).

Figure 5:
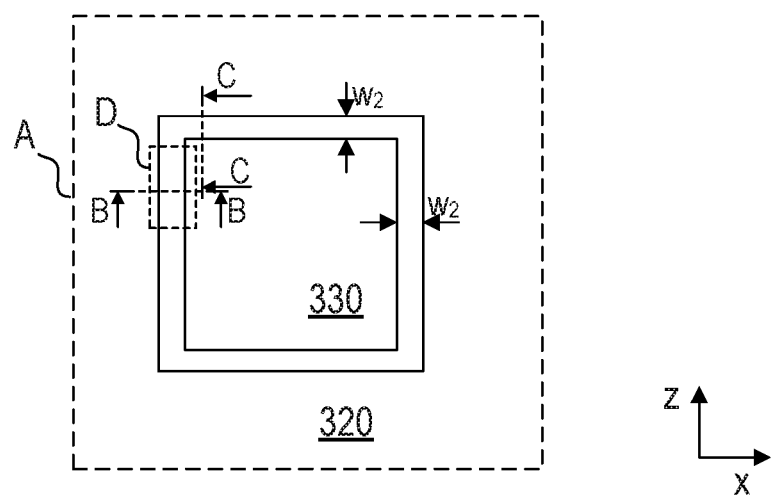
FIG. 5 schematically illustrates a section of the semiconductor body of FIG. 4 in greater detail.

A semiconductor arrangement as has been described with respect to FIGS. 2 and 3 above may be included in the semiconductor body 100 or may be formed on a surface of the semiconductor body 100. FIG. 5 schematically illustrates an area A of the semiconductor body 100 illustrated in FIG. 4 in greater detail. The area A illustrated in FIG. 5 includes the sensor pad 330 and parts of the source pad 320. A semiconductor arrangement may be electrically connected to the source pad 320 as well as to the sensor pad 330. Further, a semiconductor arrangement may be arranged partly below the source pad 320 and partly below the sensor pad 330, for example, as will be described in the following with respect to FIGS. 6 to 9.

Figure 6:
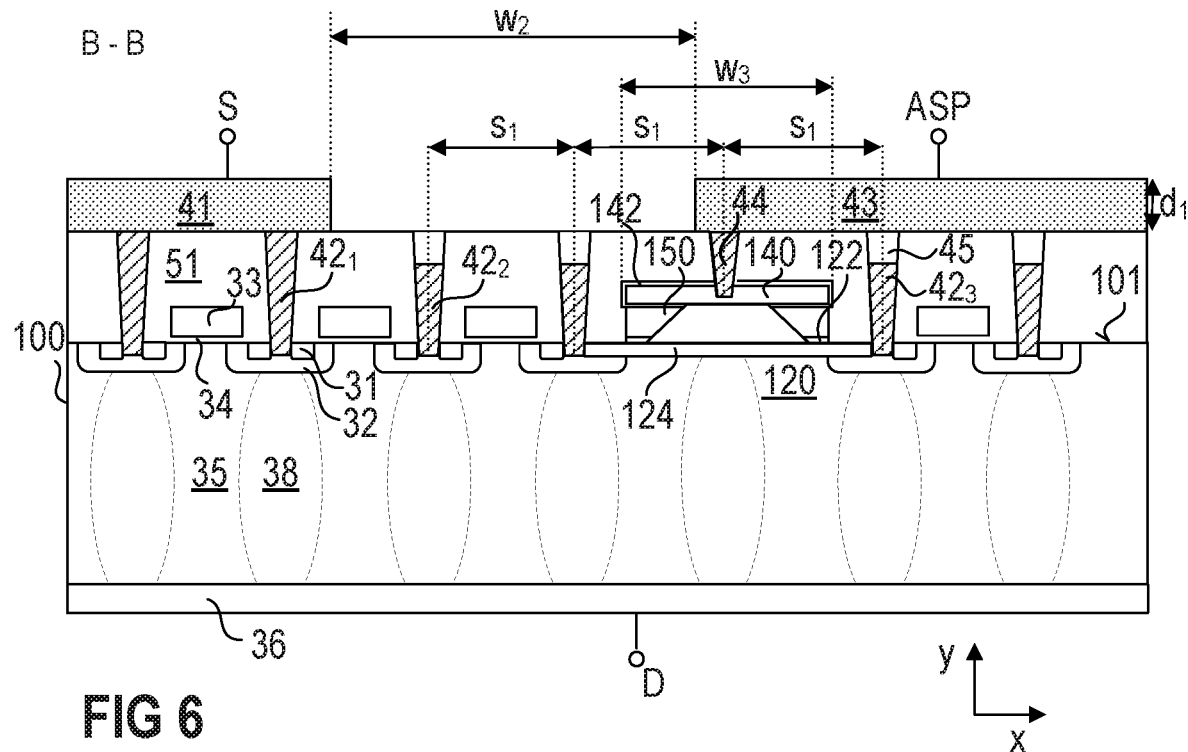
FIG. 6 schematically illustrates a cross sectional view of a semiconductor body including a semiconductor arrangement according to one example.

Now referring to FIG. 6, a cross-sectional view of the semiconductor body 100 in a section plane B-B as illustrated in FIG. 5 is schematically illustrated. A transistor device is formed in the semiconductor body 100. The semiconductor body 100 may include a conventional semiconductor material such as, for example, silicon (Si), silicon carbide (SiC), gallium nitride (GaN), gallium arsenide (GaAs), or the like. In FIG. 6, a section of the transistor device is shown which forms an active region within the semiconductor body 100. In its active region, a semiconductor device includes at least one working transistor cell with a gate electrode 33 that is dielectrically insulated from a body region 32 by a gate dielectric 34. The body region 32 is a doped semiconductor region in the active region of the semiconductor body 100. In the example illustrated in FIG. 6, the gate electrode 33 is arranged above a first surface 101 of the semiconductor body 100.

The transistor device illustrated in FIG. 6 further includes a drift region 35. The drift region 35 adjoins the body region 32 of the at least one transistor cell and forms a pn-junction with the body region 32. The drift region 35 is arranged between the body region 32 of the at least one transistor cell and a drain region 36. The drain region 36 may adjoin the drift region 35 (as illustrated). According to another example (not illustrated) a field-stop-region of the same doping type as the drift region 35, but more highly doped than the drift region 35 is arranged between the drift region 35 and the drain region 36. Further, the transistor device includes at least one compensation region 38 of a doping type complementary to the doping type of the drift region 35. According to one example, the at least one compensation region 38 adjoins the body region 32 of the at least one transistor cell. According to one example, the transistor device includes a plurality of transistor cells and each transistor cell includes a compensation region 38 adjoining the body region 32 of the respective transistor cell. In a vertical direction y of the semiconductor body 100, which is a direction perpendicular to the first surface 101, the at least one compensation region 38 extends towards the drain region 36. According to one example (not illustrated), the compensation region 38 is spaced apart from the drain region 36 so that there is a section of the drift region 35 or a buffer region between the compensation region 38 and the drain region 36. Such a buffer region may be of the same doping type as the drift region 35, but more highly doped than the drift region 35, for example. According to another example, the compensation region adjoins the drain region 36 (see FIG. 6).

Still referring to FIG. 6, the transistor device further includes a source electrode 41. The source electrode 41 is electrically connected to the source region 31 and the body region 32 of the at least one transistor cell by means of first contact plugs $42_1$. The first contact plugs $42_1$ may comprise at least one of tungsten, aluminum, copper, and a Ti/TiN barrier liner, for example. This source electrode 41 forms a source node S or is electrically connected to a source node S of the transistor device. The transistor device further includes a drain node D electrically connected to the drain region 36. A drain electrode electrically connected to the drain region 36 may form the drain node D. However, such drain electrode is not explicitly illustrated in FIG. 6.

The transistor device can be an n-type transistor device or a p-type transistor device. The device type is defined by the doping type of the source region 31. In an n-type transistor device, the source region 31 is an n-type region, the body region 32 is a p-type region, the drift region 35, which has a doping type complementary to the doping type of the body region 32, is an n-type region, and the at least one compensation region 38 is a p-type region. In a p-type transistor device, the source region 31 is a p-type region, the body region 32 is an n-type region, the drift region 35 is a p-type region, and the at least one compensation region 38 is an n-type region. The transistor device can be implemented as a MOSFET or as an IGBT. In a MOSFET, the drain region 36 has the same doping type as the drift region 35, and in an IGBT the drain region 36 (which may also be referred to as collector region) has a doping type complementary to the doping type of the drift region 35. For example, a doping concentration of the drain region 36 is selected from a range of between 1E18 and 1E19 cm$^{-3}$, 1E18 and 1E20 cm$^{-3}$, or 1E18 and 1E21 cm$^{-3}$, doping concentrations of the drift region 35 and the compensation region 38 are selected from a range of between 1E15 and 5E16 cm$^{-3}$, and a doping concentration of the body region 32 is selected from between 5E16 cm$^{-3}$ and 5E17 cm$^{-3}$. The transistor cells illustrated in the Figures are planar transistor cells. Implementing the transistor cells as planar transistor cells, however, is only one example. According to another example (not illustrated), the transistor cells are implemented as trench transistor cells. That is, the at least one gate electrode 33 is arranged in a trench that extends from the surface 101 of the semiconductor body 100 into the semiconductor body 100.

In the transistor device explained above, a plurality of transistor cells are connected in parallel. That is, the source regions 31 of these transistor cells are connected to the source node S, the common drain region 36 is connected to the drain node D, and the at least one gate electrode 33 is connected to a gate node (not illustrated in FIG. 6).

The source electrode 41 in the example of FIG. 6 is not a continuous layer, as has been described with respect to FIGS. 4 and 5 above. A sensor electrode 43 is arranged adjacent to the source electrode 41 in a horizontal direction x of the semiconductor body 100. The sensor electrode 43 forms a sensor node ASP or is electrically connected to a sensor node ASP. The source electrode 41 and the sensor electrode 43, however, are not directly connected to each other but spaced apart with a gap formed between the source electrode 41 and the sensor electrode 43. The gap may have a width $w_2$ of between 10 µm and 20 µm, for example, if the source electrode 41 and the sensor electrode 43 have a comparably great thickness $d_1$ (e.g., between 2 and 10 µm). The gap may have a width $w_2$ of between 1 µm and 10 µm, for example, if the source electrode 41 and the sensor electrode 43 have a comparably small thickness $d_1$ (e.g., between 0.5 and 5 µm). These, however, are only examples. Any other widths are also possible. The first contact plugs $42_1$ that are arranged directly below the source electrode 41 extend from the source regions 31 through a third insulation layer 51 that is formed on the top surface 101 of the semiconductor body 100 to the source electrode 41 to electrically couple the source regions 31 that are arranged below the source electrode 41 to the source electrode 41. In the Figures, the third insulation layer 51 is illustrated as a single continuous layer which extends from the surface 101 of the semiconductor body 100 to the source electrode 41. This, however, is only an example. Often, a gate oxide layer with a thickness of, e.g., 5 nm to 200 nm or 40 nm to 120 nm, is arranged on the surface 101 of the semiconductor body 100. The third insulation layer 51 may comprise this gate oxide layer and an additional layer which is formed on top of this gate oxide layer. This additional layer may comprise an undoped TEOS (tetraethyl orthosilicate) which may have a thickness of about 50 nm to 200 nm, and a doped BPSG (borophosphosilicate glass) having a thickness of about 200 nm to 2 µm or 1100 nm to 1300 nm, for example. The third insulation layer 51, therefore, may comprise several sub-layers which, however, are not explicitly illustrated in the Figures. Second contact plugs $42_2$ are arranged below the gap between the source electrode 41 and the sensor electrode 43. The second contact plugs $42_2$ may contact the transistor cells that are arranged below the gap between the source electrode 41 and the sensor electrode 43 but may not extend entirely through the third insulation layer 51. A fourth insulation layer 45 may be arranged above the second contact plugs $42_2$ in a vertical direction y of the semiconductor body 100 such that the second contact plugs $42_2$ are not exposed and cannot establish any unwanted electrical connections. The same applies to third contact plugs $42_3$ that are configured to contact transistor cells that are arranged below the sensor electrode 43. The third contact plugs $42_3$ arranged below the sensor electrode 43 may only partly extend from the respective source regions 31 through the third insulation layer 51. The third contact plugs $42_3$ arranged below the sensor electrode 43 may be electrically insulated from the sensor electrode 43 by the fourth insulation layer 45 which is arranged between the third contact plugs $42_3$ and the sensor electrode 43. The electrically conductive material of the first, second, third and fourth contact plugs $42_1$, $42_2$, $42_3$, 44 is represented as shaded areas in FIG. 6.

A semiconductor arrangement is arranged on the top surface 101 of the semiconductor body 100. The semiconductor arrangement may be arranged at least partly below the sensor electrode 43, as is illustrated in FIG. 6. The semiconductor arrangement illustrated in FIG. 6 essentially corresponds to the semiconductor arrangements as described with respect to FIG. 3 above. The second semiconductor layer 140 is electrically connected to the sensor electrode 43 by means of a fourth contact plug 44. The fourth contact plug 44 may comprise tungsten, for example. In the example illustrated in FIG. 3, the supporting layer 130 is arranged directly adjacent to the first semiconductor layer 120. In FIG. 6, the first semiconductor layer 120 is formed within the semiconductor body 100 and essentially corresponds to the drift region 35. However, in the example of FIG. 6, an implantation zone 124 is formed between the supporting layer 130 and the first semiconductor layer 120 or the drift region 35, respectively. The implantation zone 124 may extend in a horizontal direction x of the semiconductor body 100 along the whole width $w_3$ of the semiconductor arrangement. The implantation zone 124 may further extend beyond the width $w_3$ of the semiconductor arrangement. The implantation zone 124 may have a doping type complementary to the doping type of the first semiconductor layer 120. For example, the implantation zone 124 may be a p-type region if the transistor device is an n-type transistor device. The implantation zone 124 may have a doping concentration selected from a range of between 5E12 and 1E14 cm$^{-3}$. The implantation zone 124 may include boron, for example.

The semiconductor arrangement may be implemented within the active region of the transistor device. However, in a region directly below the semiconductor arrangement, no transistor cell or only parts of a transistor cell may be implemented. For example, the semiconductor arrangement may be arranged between two working transistor cells of the transistor arrangement, that is, the semiconductor arrangement may extend over only one transistor cell, as is schematically illustrated in FIG. 6 (only one compensation region 38 arranged below the semiconductor arrangement). A distance 51 between two subsequent contact plugs $42_1$, $42_2$, $42_3$, 44 may be between 3 µm and 10 µm, e.g., 5.5 µm. A width $w_3$ of the semiconductor arrangement in a first horizontal direction x of the semiconductor body 100, therefore, may be less than 20 µm or less than 6 µm, e.g., less than 11 µm ($w_3 < 2*s_1$). This, however, is only an example. According to another example, the semiconductor arrangement may extend over more than one transistor cell. That is, more than one compensation region 38 is arranged below the semiconductor arrangement (not specifically illustrated). In this example, the following would be valid: $w_3 < n*s_1$, with n>2. According to another example, the semiconductor arrangement extends in the second horizontal direction z, instead of the first horizontal direction x, as will be described with respect to FIG. 7 below. For example, the width $w_3$ of the semiconductor arrangement in the first horizontal direction x or in the second horizontal direction z of the semiconductor body 100 may be between 10 µm and 200 µm.

Figure 7:
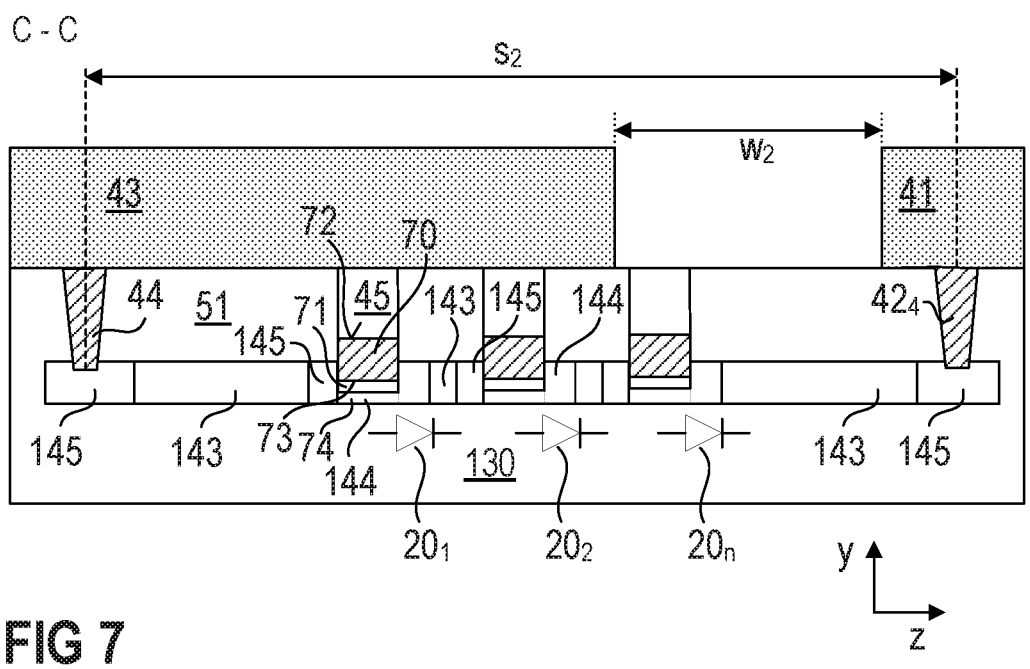
FIG. 7 schematically illustrates a cross sectional view of a section of the semiconductor arrangement of FIG. 6.

Now referring to FIG. 7, a partial cross section of the semiconductor arrangement in a second horizontal direction z of the semiconductor body 100 in a section plane C-C as illustrated in FIG. 5 is schematically illustrated. In the example illustrated in FIG. 7, however, any parts of the semiconductor arrangement and the transistor device that are arranged below the first surface 101 of the semiconductor body 100 are not illustrated for the sake of simplicity. As is illustrated in FIG. 7, the semiconductor arrangement may comprise at least one pn-junction. The at least one pn-junction may form a series connection of at least one diode $20_1, 20_2, \ldots, 20_n$ which is implied by the circuit symbols representing diodes in FIG. 7 (see also FIG. 1). A pn-junction may be formed by successive first and second junction regions 143, 144 that are of complementary doping types. For example, a first junction region 143 may be an n-type region, and a second junction region 144 may be a p-type region. In other words, a diode chain or string may be formed in the second horizontal direction z between the fourth contact plug 44 and a fifth contact plug $42_4$ having consecutive pn-junctions at the region boundaries of the first and second junction regions 143, 144. According to one exemplary embodiment, the doping concentrations of the first and second junction regions 143, 144 are adapted to form a series connection of at least two diodes $20_1$, $20_2, \ldots, 20_n$, each of the consecutive diodes $20_1$, $20_2, \ldots, 20_n$ comprising one of the first junction regions 143 and an adjacent second junction region 144.

The semiconductor arrangement, optionally, may further comprise third regions 145 that are of the same doping type as the first junction regions 143 but that are more highly doped than the first junction regions 143. A third region 145 may be arranged between two successive pn-junctions, for example. That is, between the first junction region 143 of a first pn-junction and the second junction region 144 of a successive pn-junction. Third regions 145 may further form terminal regions which are contacted by the fourth and fifth contact plugs 44, $42_4$. For example, the fourth contact plug 44 may contact a cathode of one of the diodes $20_1$, $20_2, \ldots, 20_n$ and the fifth contact plug $42_4$ may contact an anode of one of the diodes $20_1, 20_2, \ldots, 20_n$, or vice versa. A length $s_2$ of the semiconductor arrangement between the fourth contact plug 44 and the fifth contact plug $42_4$ in the second horizontal direction z may be between 10 µm and 30 µm, between 10 µm and 50 µm and even up to 500 µm or up to 1500 µm, e.g., 1000 µm.

In an arrangement without any third regions 145, a first junction region 143 of a first pn-junction and the second junction region 144 of a consecutive pn-junction form at least one additional anti-serial pn-junction. Such additional anti-serial pn-junctions are generally undesirable. A similar effect occurs in an arrangement comprising third regions 145. As the third regions 145 are of the same doping type as the first junction regions 143 which is a doping type different to the doping type of the second junction regions 144, the third regions and adjoining second junction regions 144 form at least one undesired additional anti-serial pn-junction. Still referring to FIG. 7, the semiconductor arrangement may, optionally, further comprise one or more shunting elements 70. The number of shunting elements 70 may depend on the number of additional anti-serial pn-junctions formed in the semiconductor arrangement between first regions (or third regions 145) of a first pn-junction and second junction regions 144 of consecutive pn-junctions. Each of the at least one shunting elements 70 extends partly into the semiconductor arrangement (into the second semiconductor layer 140) and is in contact with a different one of at least one of the additional anti-serial pn-junctions. The shunting elements 70 are configured to electrically shunt the additional anti-serial pn-junctions. Each shunting element 70 is in electrical contact with one of the second junction regions 144 and an adjoining first or third region 143, 145. A first end 72 of the shunting element 70 extends into and is in direct contact with the third insulation layer 51. A second end 73 of the shunting element 70 extends into one of the second junction regions 144 and is interposed between the respective second junction region 144 and an adjoining first or third region 143, 145 in the second horizontal direction z of the semiconductor body 100. The shunting element 70 may be a buried structure, e.g., a buried plug. That is, the shunting element 70 may not extend all the way through the third insulation layer 51 from the second junction regions 144 to the sensor electrode 43. The shunting element 70 may only partly extend through the third insulation layer 51 and may be covered by the fourth insulation layer 45. That is, the fourth insulation layer 45 is arranged between the shunting element 70 and the sensor electrode 43 in order to prevent an electrical connection between the shunting element 70 and the sensor electrode 43.

The at least one shunting element 70 may comprise a highly doped polysilicon or a metal, for example. According to one example, the at least one shunting element 70 comprises tungsten. Alternatively, the at least one shunting element 70 may comprise a highly doped polysilicon, AlCu, or a barrier liner, wherein the barrier liner may include at least one of, e.g., Ti and Ti/N. According to another example, the shunting element 70 comprises polysilicon having a net dopant concentration of at least $1*10^{19}$ cm$^{-3}$, for example. Other suitable materials, however, are also possible.

According to another example and as further illustrated in FIG. 7, an additional shunting layer 71 may be arranged adjacent to the shunting element 70 and adjoining the second end 73 of the shunting element 70. The additional shunting layer 71, therefore, may be arranged between the second end 73 of the shunting element 70 and the respective second junction region 144 in a vertical direction y of the semiconductor body 100. The additional shunting layer 71 may comprise a metal silicide such as $TiSi_2$, for example. According to one example, the additional shunting layer 71 is electrically coupled to a highly doped layer 74 which is of the same doping type as the respective second junction region 144 but may be more highly doped than the second junction region 144.

Each of the at least one shunting arrangement including a shunting element 70, an additional shunting layer 71, and a highly doped layer 74 is configured to shunt one of the at least one additional pn-junctions. Therefore, effectively an additional pn-junction between two neighboring second junction regions 144 and first or third regions 143, 145 is electrically shunted or prevented if a respective shunting element 70 and additional shunting layer 71 are provided.

As has been described with respect to FIGS. 6 and 7 above, one or more pn-junctions may be arranged successively in the semiconductor arrangement in a second horizontal direction z of the semiconductor body 100. This, however, is only an example. According to another example, one or more pn-junctions may be formed in the semiconductor arrangement, in particular in the second semiconductor layer 140, in a first horizontal direction x of the semiconductor body 100, wherein the first horizontal direction x is perpendicular to the second horizontal direction z. This is exemplarily illustrated in FIGS. 8 and 9.

Figure 8:
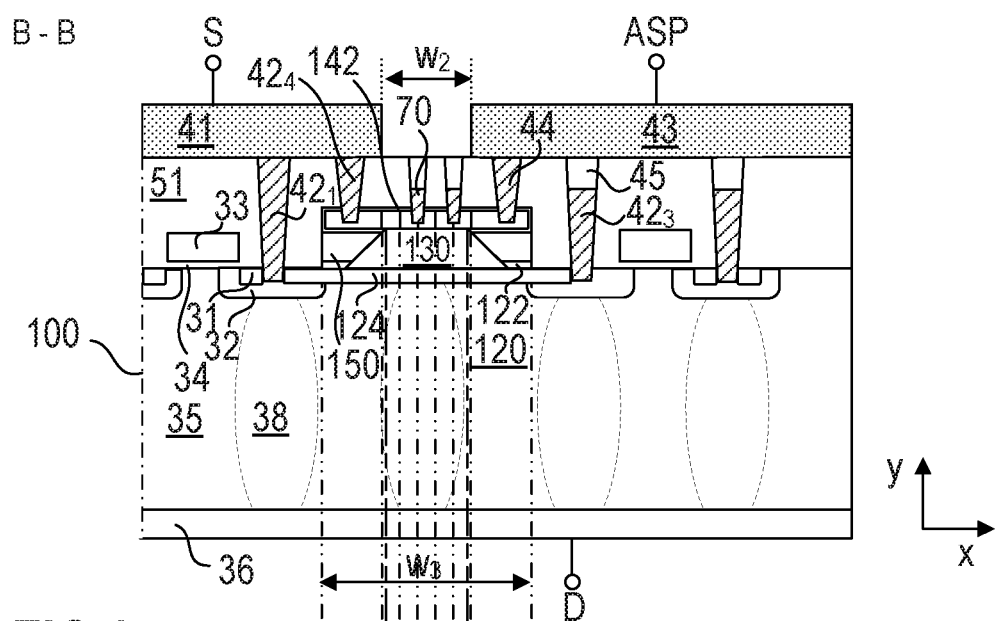
FIG. 8 schematically illustrates a cross sectional view of a semiconductor arrangement according to one example.
Figure 9:
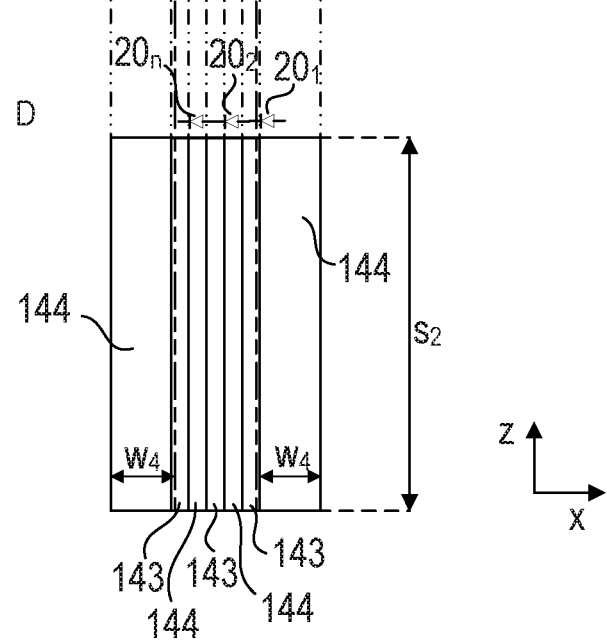
FIG. 9 schematically illustrates a top view of a section of the semiconductor arrangement of FIG. 8.

FIG. 8 schematically illustrates a cross-sectional view of a semiconductor arrangement in a section plane B-B as illustrated in FIG. 5. FIG. 9 schematically illustrates a top view of the area D as illustrated in FIG. 5. In the present example, the semiconductor arrangement has a width $w_3$ that is greater than the width $w_2$ of the gap between the source electrode 41 and the sensor electrode 43. The second semiconductor layer 140 may be electrically coupled to the source electrode 41 by means of a fifth contact plug $42_4$ and to the sensor electrode 43 by means of a fourth contact plug 44. The fifth contact plug $42_4$ may contact the second semiconductor layer 140 in a section that is arranged adjacent to the first material 150 on a first side, and the fourth contact plug 44 may contact the second semiconductor layer 140 in a section that is arranged adjacent to the first material 150 on a second side of the second semiconductor layer 140.

One or more pn-junctions may be formed in the second semiconductor layer 140, wherein each pn-junction is formed between a first junction region 143 and an adjoining second junction region 144. As has been described above, the at least one pn-junction may form a series connection of at least one diode $20_1, 20_2, \ldots, 20_n$ which is implied by the circuit symbols in FIG. 9. As has been further described above, in a chain of two or more successive pn-junctions, additional pn-junctions may be formed between the first junction region 143 of a first pn-junction and the second junction region 144 of an adjoining pn-junction. Such additional pn-junctions may be shunted or prevented by means of shunting elements 70, as has been described with respect to FIG. 7 above. In FIG. 8, shunting elements 70 are only schematically indicated. The arrangement and function of such shunting elements 70 and respective additional shunting layers (not explicitly illustrated in FIG. 8) may be similar to the arrangement and function as has been described with respect to FIG. 7 above.

In the example illustrated in FIGS. 8 and 9, the first and second junction regions 143, 144 are elongated regions. That is, a length $s_2$ of the first and second junction regions 143, 144 in the second horizontal direction z is significantly larger than a width of the first and second junction regions 143, 144 in the first horizontal direction x. A second junction region 144 may form a contact region that is contacted by a fifth contact plug $42_4$, and a further second junction region 144 may form a further contact region that is contacted by the fourth contact plug 44, for example. The two contact regions may be arranged adjacent to the undercuts between the second semiconductor layer 140 and the first semiconductor layer 120 that are filled with the first material 150. The undercuts may have a maximum depth $w_4$ in the first horizontal direction x. The maximum depth $w_4$ may be, e.g., up to 5.5 µm.

As has been described with respect to FIGS. 6 to 9 above, the semiconductor arrangement may be arranged above or close to an active cell field of a transistor device arranged within the semiconductor body 100. As the thermal conductivity $\lambda_2$ of the first material 150 is higher than the thermal conductivity $\lambda_1$ of the supporting layer 130, heat that is generated in the transistor device is transferred to the second semiconductor layer 140 mainly via the first material 150. For example, at room temperature, the thermal conductivity $\lambda_2$ of the first material 150 (e.g. polysilicon) may be 90 times larger than the thermal conductivity $\lambda_1$ of the supporting layer 130 (e.g. silicon dioxide). That is, the second semiconductor layer 140 is mainly heated by the first semiconductor layer 120 via the first material 150. A temperature at least in parts of the second semiconductor layer 140, therefore, may be similar to a temperature of the transistor device. A sensor device that is formed in or on the second semiconductor layer 140, therefore, may detect a temperature that is representative of a temperature in the transistor device. For example, a current flowing through the at least one pn-junction or at least one diode $20_n$ or a forward voltage Vf of the at least one diode $20_n$ may be detected. If a constant forward current is forced through at least one diode $20_n$, the resulting forward voltage Vf of the at least one diode $20_n$ generally depends on the temperature of the pn-junction or diode $20_n$. Therefore, the detected forward voltage Vf is indicative of the temperature of the second semiconductor layer 140 and also of the temperature of the transistor device. If the semiconductor arrangement including the sensor device is not arranged on the active cell field of the transistor device but in an area adjacent to the active cell field, the temperature of the second semiconductor layer 140 may be lower than the temperature of the transistor device, as the temperature may not be directly transferred to the second semiconductor layer 140. This may increase the response time of the sensor device.

Figure 10:
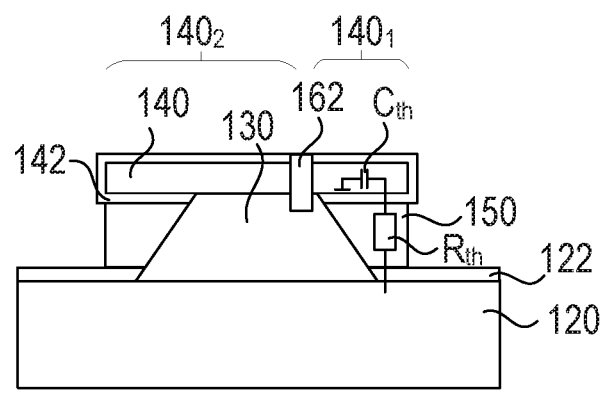
FIG. 10 illustrates a cross sectional view of a semiconductor arrangement according to another example.

According to another example that is schematically illustrated in FIG. 10, the sensor device may be at least partly arranged in a sensor area $140_1$, which is an area of the second semiconductor layer 140 that is arranged adjacent to the first material 150. As has been described above, heat from the transistor device or, more generally speaking, from the first semiconductor layer 120 is mainly transferred to the second semiconductor layer 140 via the first material 150. The thermal resistance $R_{th}$ of the first material 150 may be comparably low. A short response time of the sensor device is crucial for many applications in order to be able to avoid a thermal overload of the transistor device. The supporting layer 130, having a comparably low thermal conductivity (high thermal resistance $R_{th}$), provides a reasonably good thermal isolation between the first semiconductor layer 120 and the second semiconductor layer 140. The thermal capacitance $C_{th}$ of the second semiconductor layer 140 may be rather high. For some applications, it may be desirable to reduce the thermal capacitance $C_{th}$ of the second semiconductor layer 140. According to one example, the semiconductor arrangement, therefore, may include a region formed of second material 162 having a thermal conductivity that is less than the thermal conductivity of the second semiconductor layer 140. The region of second material 162 is configured to thermally decouple a first area $140_2$ of the second semiconductor layer 140 from the sensor area $140_1$. With the thermal conductivity of the second material 162 being comparably low, heat from the sensor area $140_1$ is only transferred to the remaining first area $140_2$ of the second semiconductor layer 140 to a very limited extent. This may significantly reduce the thermal capacitance $C_{th}$ of the sensor area $140_1$. As is exemplarily illustrated in FIG. 10, the second material 162 may extend though the second semiconductor layer 140 in a vertical direction y. In this way, the sensor area $140_1$ may be at least partly separated and thereby thermally decoupled from the remaining first area $140_2$. This thermal decoupling may lead to a faster response time of the sensor device and a higher accuracy of the temperature measurements. The sensor device may be at least partly arranged in the sensor area $140_1$. However, some parts of the sensor device may also be arranged in the remaining first area $140_2$. That is, the sensor device may extend from the sensor area $140_1$ into the remaining first area $140_2$. For example, at least the terminal regions which are contacted by the fourth and fifth contact plugs 44, $42_4$ may be arranged in the first area $140_2$.

Figure 11A:
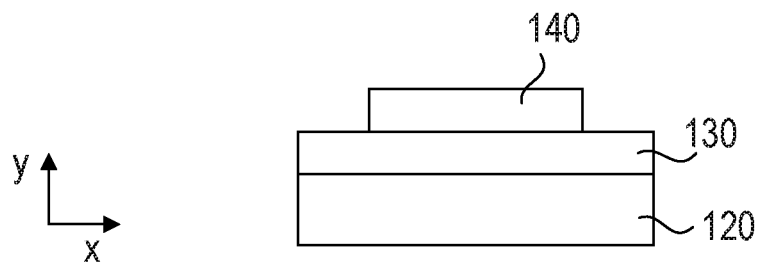
FIGS. 11A through 11G schematically illustrate a method for producing a semiconductor arrangement according to one example.

Now referring to FIGS. 11A through 11G, an exemplary method for producing a semiconductor arrangement is schematically illustrated. As is schematically illustrated in FIG. 11A, a supporting layer 130 is arranged between a first semiconductor layer 120 and a second semiconductor layer 140. The second semiconductor layer 140 may be a structured layer, for example. That is, the second semiconductor layer 140 is arranged only on some parts of the supporting layer 130, while other parts of the supporting layer 130 are not covered by the second semiconductor layer 140. The first semiconductor layer 120 may include a conventional semiconductor material such as, for example, silicon (Si), silicon carbide (SiC), gallium nitride (GaN), gallium arsenide (GaAs), or the like. The first semiconductor layer 120 may have a thickness of at least 5 µm, for example. The supporting layer 130 may include at least one of an oxide, a nitride, an oxynitride, a high-k material, an imide, an insulating resin or glass, for example. The supporting layer 130 may include a field dielectric such as a field oxide or a gate dielectric, e.g., a gate oxide. The supporting layer 130 may include a field oxide formed, e.g., by a local oxidation of silicon (LOCOS) process, deposited oxide or shallow trench isolation (STI). A thickness of the supporting layer 130, that is, a distance between the first semiconductor layer 120 and the second semiconductor layer 140, may be at least 500 nm or at least 800 nm, for example. The second semiconductor layer 140 may be a polycrystalline silicon layer, for example. The second semiconductor layer 140 may have a thickness of at least 200 nm or at least 300 nm, for example.

Figure 11B:
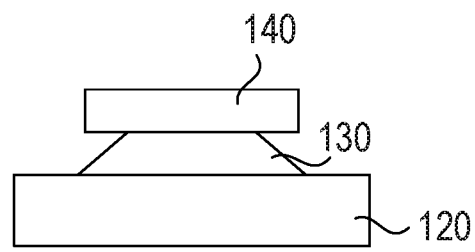

As is schematically illustrated in FIG. 11B, the supporting layer 130 is partly removed. An etching process may be used to partly remove the supporting layer 130, for example. During this etching process, the second semiconductor layer 140 may function as a protective layer. That is, the supporting layer 130 is etched only in those areas that are not covered by the second semiconductor layer 140. However, during the etching process, undercuts may be formed between the first semiconductor layer 120 and the second semiconductor layer 140. The resulting structure after the etching process which includes undercuts between the first and the second semiconductor layers 120, 140 is schematically illustrated in FIG. 11B.

Figure 11C:
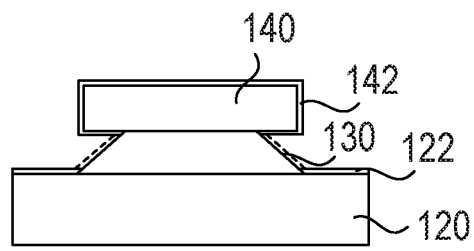
Figure 11D:
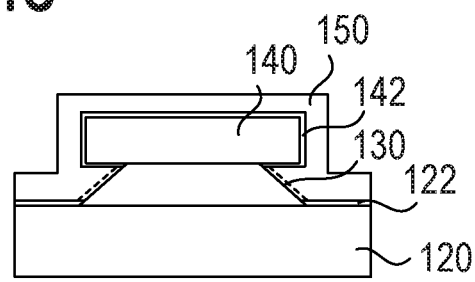

Now referring to FIG. 11C, an insulation layer 122, 142 may be deposited on exposed surfaces of the first semiconductor layer 120, the supporting layer 130, and the second semiconductor layer 140. The insulation layer 122, 142 may include at least one of an oxide, a nitride, an oxynitride, a high-k material, an imide, an insulating resin or glass, for example. The insulation layer may include a field dielectric such as a field oxide or a gate dielectric, e.g., a gate oxide. In FIG. 11C, the insulation layer is designated as first insulation layer 122 in those parts covering the first semiconductor layer 120, and as second insulation layer 142 in those parts covering the second semiconductor layer 140. In those parts, where it covers the supporting layer 130, the insulation layer is indicated in dashed lines. The insulation layer may comprise the same material as the supporting layer 130. Therefore, it may be regarded as part of the supporting layer 130 in those parts where it covers the supporting layer 130 (indicated in dashed lines in FIG. 11C). The insulation layer may include a thermally grown oxide, for example. The thickness of such an insulation layer including a thermally grown oxide in those parts where it covers the supporting layer 130 may be in the range of several nanometers, for example. In those parts where it covers the first semiconductor layer 120 and the second semiconductor layer 140, however, the thickness of a thermally grown oxide may be greater than several nanometers. According to another example, the insulation layer may be deposited using a CVD (chemical vapor deposition) process. In this case, the insulation layer may have essentially the same thickness in those areas where it covers the supporting layer 130 as in those areas where it covers the first semiconductor layer 120 and the second semiconductor layer 140.

Figure 11E:
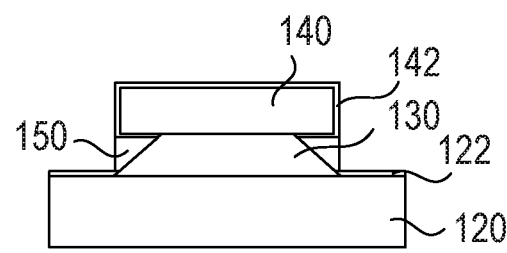

In a following step, the undercuts may be filled with a first material 150. Therefore, a layer of the first material 150 may be formed on the first and second semiconductor layers 120, 140 with the first and second insulation layers 122, 142 arranged between the first material 150 and the first and second semiconductor layers 120, 140, respectively. During the process of depositing the first material 150, the undercuts between the first and second semiconductor layers 120, 140 may be at least partly filled with the first material 150. In the example illustrated in FIG. 11D, the undercuts are completely filled with the first material 150. This, however, is only an example. It is possible that the first material 150 does not reach such areas that are arranged at the far back of the undercuts below the second semiconductor layer 140. Therefore, the undercuts may not always be completely filled with the first material 150 and small cavities may remain between the second semiconductor layer 140 and the supporting layer 130. After depositing the first material 150, the first material 150 may then be removed in such areas that are not arranged within the at least one undercut, as is schematically illustrated in FIG. 11E. For example, an anisotropic etching process may be used to remove the first material 150.

Figure 11F:
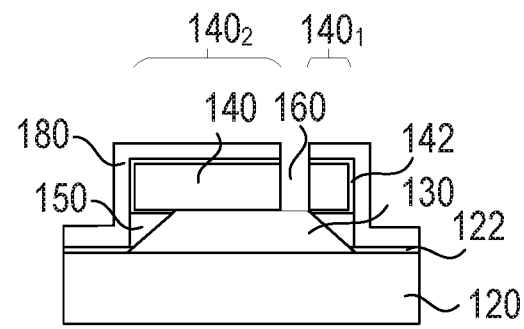

Now referring to FIG. 11F, a masking layer 180 may be formed. The masking layer 180 may cover exposed surfaces of the first insulation layer 122 and of the first material 150. Further, the masking layer 180 may partly cover the exposed surfaces of the second insulation layer 142. However, there may be openings in the masking layer 180. In a following etching process, at least one trench 160 may be formed in those areas that are not covered by the masking layer 180. The at least one trench 160 may extend through the second insulation layer 142 and the second semiconductor layer 140 in a vertical direction y. The at least one trench 160 may separate at least one sensor area $140_1$ from remaining first areas $140_2$ of the second semiconductor layer 140, as has been described with respect to FIG. 10 above.

Figure 11G:
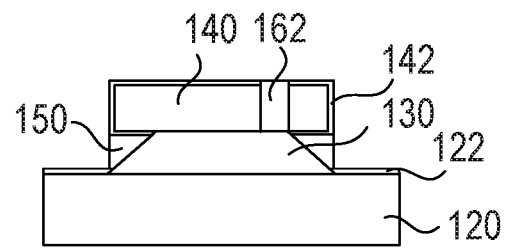

The at least one trench 160 may then be filled with a second material 162, as is schematically illustrated in FIG. 11G. The second material 162 may have a thermal conductivity that is less than the thermal conductivity of the second semiconductor layer 140. The second material 162 may comprise an oxide, a thermal oxide or an interlevel oxide (TEOS or BPSG), for example. Using a further masking layer 180, however, is only an example. It is also possible to form the at least one trench 160 without the use of an additional mask. For example, the at least one trench 160 may be formed in the same step during which the second semiconductor layer 140 is etched. Initially, the second semiconductor layer 140 may be a continuous layer which is partly removed during a patterning step. That is, the second semiconductor layer 140 may have dimensions that are greater than the final dimensions (width $w_3$, length $s_2$) after the patterning step (see, e.g., FIG. 9). After performing this patterning step during which the at least one trench may be formed as well, the at least one trench 160 may be filled with a photoresist which is used for the field oxide mask in a subsequent field oxide etching process (etching of the supporting layer 130). Once the field oxide has been etched and the photoresist has been removed, the at least one trench 160 may then be oxidized during a following gate oxidation and may later on be filled with an interlevel oxide (TEOS and/or BPSG) which forms the second material 162.

Figure 12:
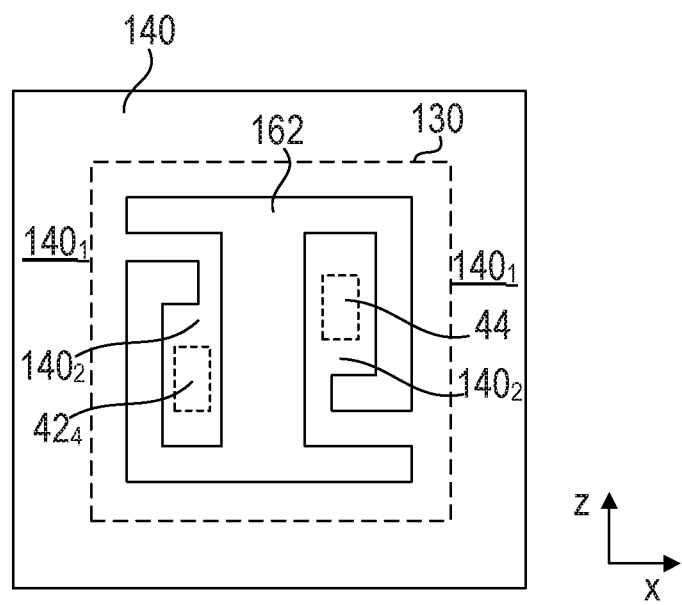
FIG. 12 schematically illustrates a top view of a section of the semiconductor arrangement of FIG. 10.

As is schematically illustrated in FIG. 12, the second material 162 may be arranged such that a sensor area $140_1$ is thermally decoupled from first areas $140_2$, wherein the first areas $140_2$ may function as connection areas. That is, the first areas $140_2$ may be areas where the fifth contact plugs $42_4$ and the fourth contact plugs 44 are arranged to contact the second semiconductor layer 140. FIG. 12 schematically illustrates a top view on a semiconductor body including an exemplary semiconductor arrangement. The top view illustrates an area of the second semiconductor layer 140. A supporting layer 130 arranged below the second semiconductor layer 140 in a vertical direction y is indicated in dashed lines in FIG. 12, as it is covered by the second semiconductor layer 140. Indicated also in dashed lines are connecting areas $140_2$, where the fourth contact plugs 44 and the fifth contact plugs $42_4$ contact the second semiconductor layer 140. The example in FIG. 12 illustrates a two wire connection, that is, one fourth contact plug 44 and one fifth contact plug $42_4$ are used to electrically connect the second semiconductor layer 140 to a first metallization 41 and a second metallization 43, respectively (first and second metallization 41, 43 not illustrated in FIG. 12). This, however, is only an example. It is also possible to electrically contact the second semiconductor layer 140 with more than one fourth contact plug 44 and more than one fifth contact plug $42_4$. The second material 162 partly surrounds the connection areas $140_2$ in horizontal directions x, z of the semiconductor body 100. However, a connection may remain to allow an electric current to flow between the connection areas $140_2$ and the at least one sensor area $140_1$. The shape of the second material 162 illustrated in FIG. 12 is merely an example. Any other shapes are possible to thermally decouple the connection areas $140_2$ from the at least one sensor area $140_1$. For example, the second material 162 may be arranged in meander shaped connecting lines (not illustrated).

Figure 13:
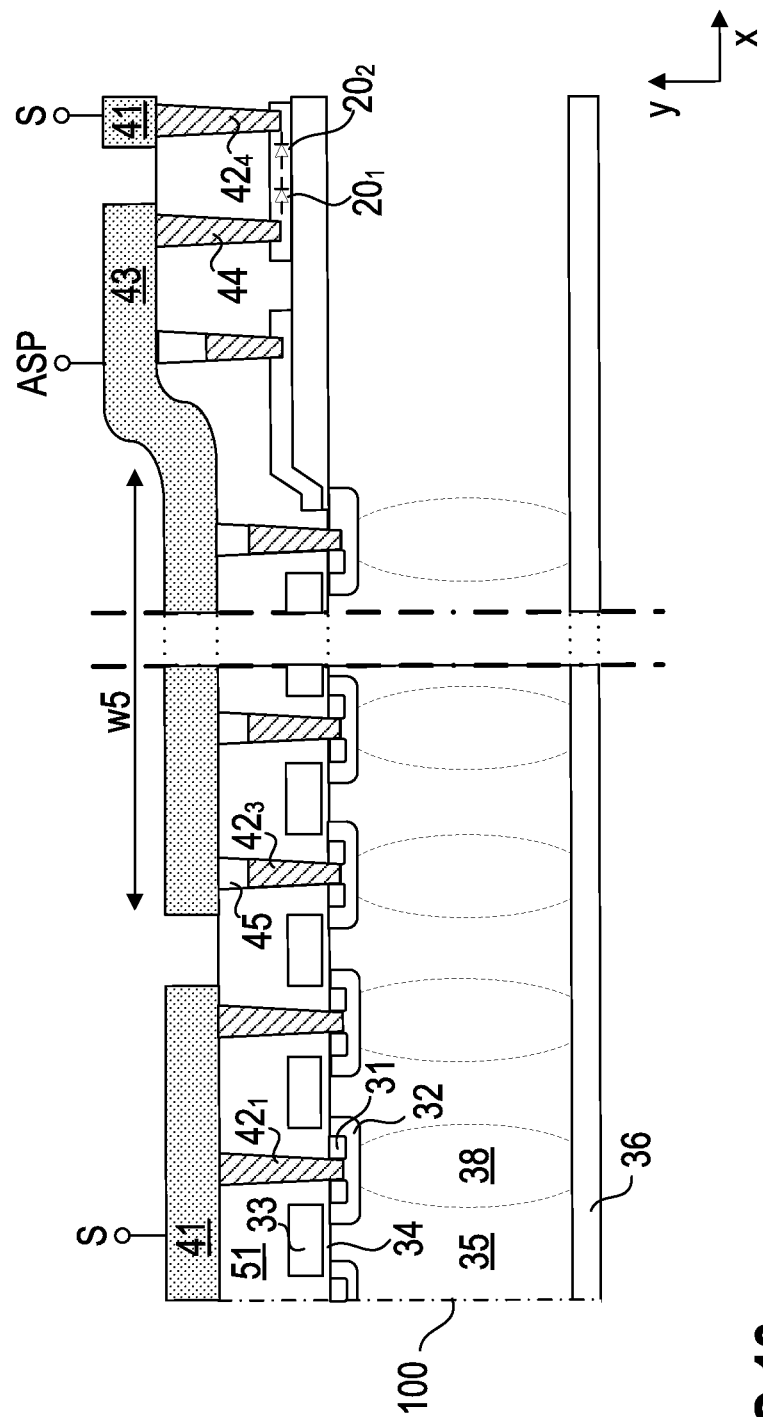
FIG. 13 schematically illustrates a cross sectional view of a semiconductor body including a semiconductor arrangement according to a further example.

As has been described with respect to FIGS. 6 to 9 above, the semiconductor arrangement and the sensor pad 330 may be arranged in an active region of the transistor device arranged within the semiconductor body 100. This, however, is only an example. According to another example which is schematically illustrated in FIG. 13, the semiconductor arrangement may alternatively be arranged in a passive region of the transistor device arranged within the semiconductor body 100. A passive region of the transistor device may be a region that does not include all active components that are necessary to form a functioning (working) transistor cell (active components are, e.g., gate oxide, source regions 31, body regions 32, gate electrodes 33, or drain regions 36). Further, a passive region may include a field oxide instead of a gate oxide. In active regions, the gate oxide may form the first insulation layer 122, as has been described above. A passive region, e.g., may be a region adjacent to the horizontal edges of the semiconductor body 100 (edge region). The sensor pad 330, or second metallization 43, respectively, however, may be at least partly arranged in an active region of the transistor device. That is, active components of the transistor device (e.g., gate oxide, source regions 31, body regions 32, gate electrodes 33, compensation regions 38) may be arranged below the second metallization 43. The second metallization 43, however, may extend to passive regions of the transistor device in order to electrically contact the semiconductor arrangement and the sensor device.

In FIG. 13, the semiconductor arrangement is only indicated by diodes $20_1$, $20_2$. As indicated in FIG. 13, a part of the second metallization 43 may be used as a bonding area (see also bonding area BA of FIG. 14). That is, a bonding wire may be bonded to this section of the second metallization 43 in order to electrically contact the second metallization. In FIG. 13 this section of the second metallization is indicated with a width $w_5$. Any contact plugs that are arranged underneath the second metallization 43 may be electrically insulated from the second metallization 43 by means of the fourth insulation layer 45 in order to prevent electrical short circuits between the second metallization 43 and the first metallization 41. In FIG. 13, this applies to the third contact plugs $42_3$, for example.

Figure 14:
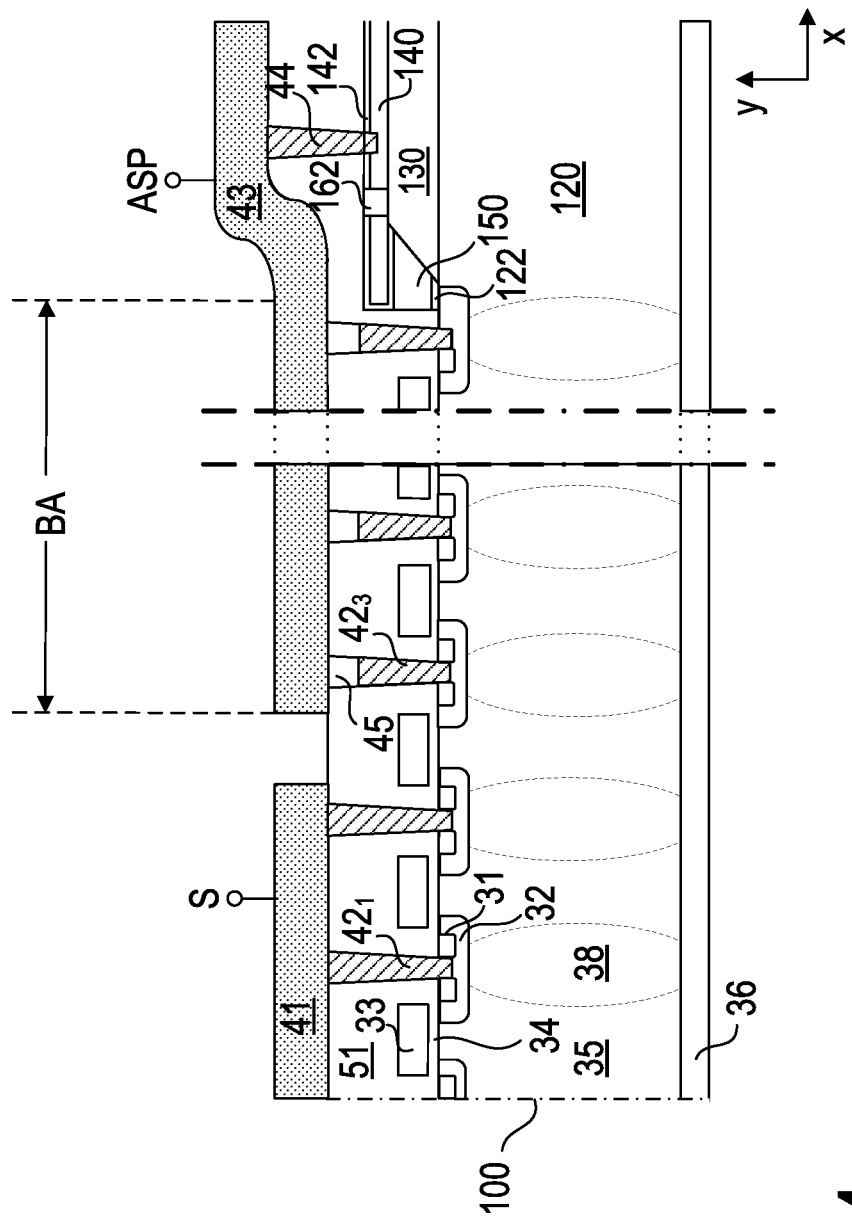
FIG. 14 schematically illustrates a cross sectional view of a semiconductor body including a semiconductor arrangement according to a further example.

Now referring to FIG. 14, in an alternative example, the semiconductor arrangement may be arranged in a high-voltage edge termination zone of the semiconductor body 100. The high-voltage edge termination zone is arranged in a passive region of the transistor device. The second metallization 43 may be arranged in an active region of the transistor device but may extend into passive regions of the transistor device in order to electrically contact the semiconductor arrangement. The semiconductor arrangement, while being arranged in a passive area of the transistor device, may be arranged in a part of the passive areas which is arranged directly adjacent to the active area of the transistor device. For example, as illustrated in FIG. 14, the undercut filled with the first material 150 may be arranged adjacent to the body region 32 of one of the transistor cells. In this way, the thermal coupling between the active area of the transistor device, where heat is generated, and the semiconductor arrangement is still sufficient to allow for fast reaction times and accurate measurements. That is, a temperature detected by a sensor device arranged in the semiconductor arrangement essentially equals the temperature of the transistor device. Other parts of the semiconductor arrangement may be thermally decoupled by means of a second material 162, as has been described with respect to FIGS. 10 and 12 above.

The second metallization 43 which forms the active sensor pad ASP is usually contacted by means of bonding wires (not illustrated in FIG. 14). Such a bonding wire may be bonded to the second metallization 43 in a designated bonding area BA. The bonding area BA, for example, may be formed by such parts of the second metallization 43 that are arranged on active areas of the transistor device, as is exemplarily illustrated in FIG. 14. However, it is also possible to provide a bonding area BA on such parts of the second metallization 43 that are arranged on passive areas of the transistor device (not illustrated).

As has been described with respect to FIGS. 7 and 9 above, and as is further illustrated in FIG. 15, the semiconductor arrangement may be an elongated structure. That is, a length $s_2$ of the semiconductor arrangement in the second horizontal direction z is large as compared to a width $w_3$ of the semiconductor arrangement in the first horizontal direction x. As has been described above, the length $s_2$ of the semiconductor arrangement in the second horizontal direction z may be between 50 µm and 1500 µm, between 100 µm and 1500 µm, or between 500 µm and 1500 µm, e.g., 1000 µm. The undercuts are generally formed on opposite sides along the whole length $s_2$ of the semiconductor arrangement. After forming the undercuts and before filling the undercuts with the first material 150, the second semiconductor layer 140 comprises free standing structures in those areas adjacent to the undercuts (see FIGS. 11B and C). The semiconductor arrangement in this intermediate state has a table-like structure. The thickness of the second semiconductor layer 140, however, is rather small as has been described with respect to FIG. 11A above. E.g., the second semiconductor layer 140 may have a thickness $d_2$ of 200 mm, 300 nm, 500 nm or up to 1 µm. The protruding areas of the second semiconductor layer 140 arranged adjacent to the undercuts may have a length $w_4$ of about 4.5 µm, for example. In other words, the maximum depth $w_4$ of the undercuts in the first horizontal direction x may be about 4.5 µm. Other depths $w_4$, however, are also possible. Different thicknesses $d_2$ of the second semiconductor layer 140 of, e.g., about 200 nm up to about 1 µm and a maximum depth $w_4$ of the undercuts of about 4.5 μm leads to a limited aspect ratio ($w_4/d_2$=4.5 μm/200 . . . 1000 nm) of approximately 4 to 22 (see, e.g., FIG. 16A). Other aspect ratios are possible for different thicknesses of the second semiconductor layer 140 and different maximum depths $w_4$ of the undercuts. Such limited aspect ratios are tolerable for many applications. The semiconductor arrangement, however, may be mechanically instable in this intermediate state with the undercuts formed between the first semiconductor layer 120 and the second semiconductor layer 140. For example, the mechanical stability of the structure may be adversely affected by wet etching processes or during drying sequences. Due to capillary forces between adjacent structures, for example, the protruding areas of the second semiconductor layer 140 may stick to the supporting layer 130 or to the first semiconductor layer 120. There is also a high risk of cracks being formed in the second semiconductor layer 140, especially in those areas that are arranged adjacent to the undercuts. Therefore, there is a risk of an increased defect count and the yield loss may be high.

In order to increase the mechanical stability of the semiconductor arrangement, the semiconductor arrangement may comprise at least one supporting structure 132. The at least one supporting structure 132 may be formed by parts of the supporting layer 130. For example, the supporting layer 130 may comprise sections which protrude from under the second semiconductor layer 140 in the first horizontal direction, the protruding sections forming at least one supporting structure 132. A semiconductor arrangement with a supporting structure 132 is schematically illustrated in FIG. 15. The semiconductor arrangement may comprise one supporting structure 132 arranged along the length $s_2$ of the supporting structure. However, in other embodiments, two or more supporting structures 132 are arranged along the length $s_2$ of the semiconductor arrangement. The number of supporting structures 132 may depend on the length $s_2$ of the semiconductor arrangement. The supporting layer 130, therefore, may have a first minimum width $w_7$ ($w_7$=($w_3$−2*$w_4$), see FIGS. 9, 16A) in those areas where undercuts are formed between the first semiconductor layer 120 and the second semiconductor layer 140, and may have a second width $w_5$ ($w_5$=$w_3$+2*$w_6$, see FIG. 16B) where a supporting structure 132 is formed. The second width $w_5$ may be 22 μm or more, for example. The protruding portion of the supporting layer 130 may have a width $w_6$ of about 4.5 μm, for example. The at least one supporting structure 132 may have a breadth $s_3$ of about 9 μm, for example.

FIG. 16A schematically illustrates a cross sectional view of a semiconductor arrangement in a section plane E-E as illustrated in FIG. 15, that is in an area where undercuts are formed between the first semiconductor layer 120 and the second semiconductor layer 140. FIG. 16A essentially corresponds to the structure which has been described comprehensively with respect to FIG. 3 above. FIG. 16B schematically illustrates a cross sectional view of a semiconductor arrangement in a section plane E'-E' as illustrated in FIG. 15, that is in an area where a supporting structure 132 is formed. The supporting layer 130 in this area protrudes from under the second semiconductor layer 140. That is, no undercuts are formed in this section of the semiconductor arrangement. The thermal conductivity between the first semiconductor layer 120 and the second semiconductor layer 140, therefore, is low in the areas of the supporting structures 132. Therefore, according to one example, no sensor device may be formed in sections of the second semiconductor layer 140 that are arranged adjacent to one of the at least one supporting structure 132.

Figure 17A:
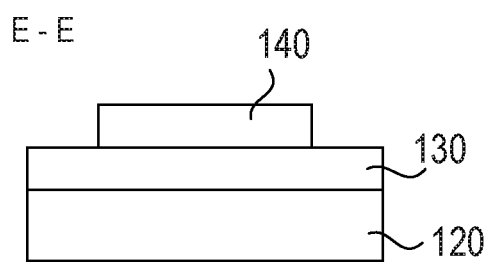
FIGS. 17A and 17B schematically illustrate a method for producing a first section of the semiconductor arrangement of FIG. 15.
Figure 18A:
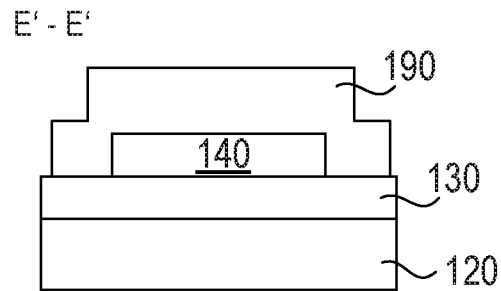
FIGS. 18A through 18C schematically illustrate a method for producing a second section of the semiconductor arrangement of FIG. 15.
Figure 17B:
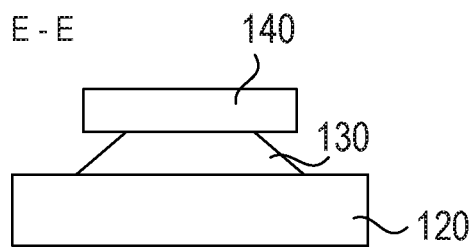
Figure 18B:
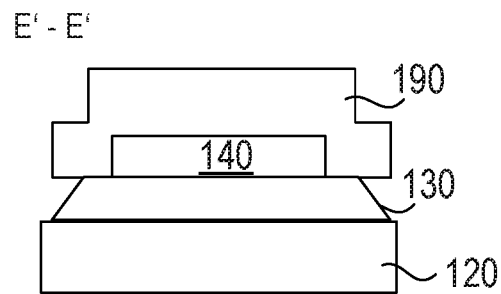
Figure 18C:
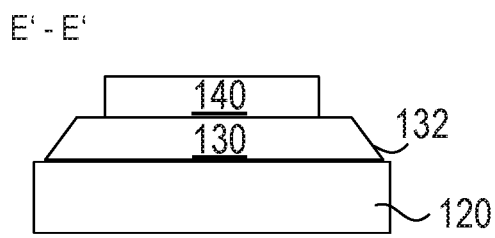

Forming the at least one supporting structure 132 does not require additional etching processes. The at least one supporting structure 132 may be formed during the same etching process that is used to form the undercuts. This is exemplarily illustrated by means of FIGS. 17A-17B and 18A-18C. Referring to FIG. 18A, a masking layer 190 may be locally arranged on the second semiconductor layer 140 and on parts of the supporting layer 130. Arranging the masking layer 190 on parts of the second semiconductor layer 140, however, is optional. The second semiconductor layer 140 itself may function as a masking layer during the etching process. Therefore, it would be sufficient to only arrange the masking layer 190 on parts of the supporting layer 130 adjacent to the second semiconductor layer 140. FIG. 18A illustrates a cross sectional view of the semiconductor arrangement in a section plane E'-E' as illustrated in FIG. 15. FIG. 17A illustrates a cross sectional view of the semiconductor arrangement in section plane E-E as illustrated in FIG. 15. FIG. 17A corresponds to FIG. 11A that has already been described above and illustrates the semiconductor arrangement before the etching process in those sections where undercuts are to be formed. During the following etching process, the undercuts are formed in those areas of the semiconductor structure that are not covered by the masking layer 190 (see FIG. 17B). However, as is schematically illustrated in FIG. 18B, no undercuts between the first semiconductor layer 120 and the second semiconductor layer 140 are formed in those sections where the masking layer 190 is arranged on the supporting layer 130. During the etching process, undercuts are formed between the first semiconductor layer 120 and the masking layer 190, as is illustrated in FIG. 18B. However, when the masking layer 190 is removed after finishing the etching process, the undercuts between the first semiconductor layer 120 and the masking layer 190 are naturally removed and the protruding areas of the supporting layer 130 remain to form the supporting structure 132, as is illustrated in FIG. 18C.

Figure 19A:
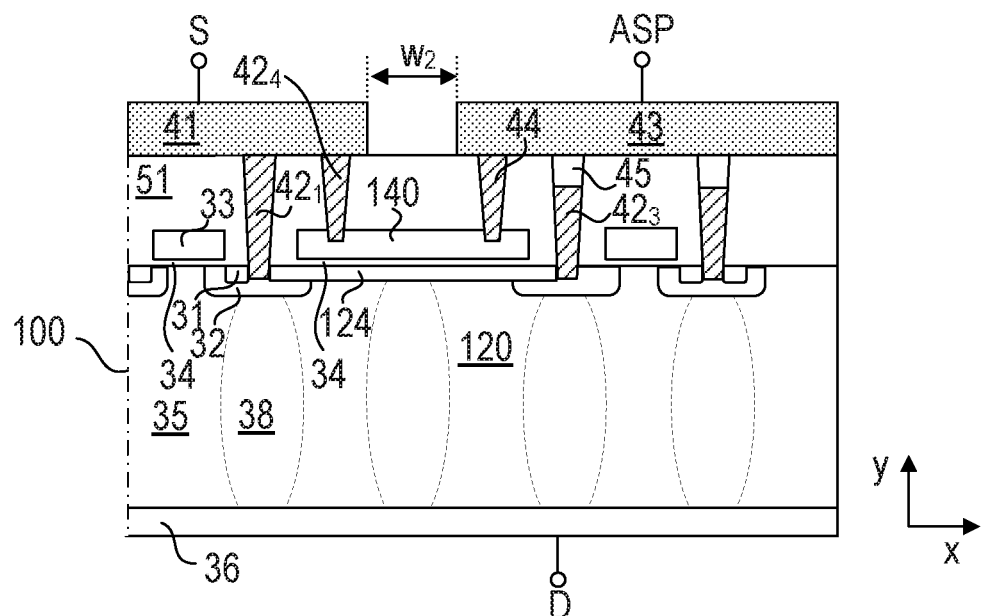
FIGS. 19A and 19B schematically illustrate cross sectional views of a semiconductor device including a sensor device according to an example.

Now referring to FIG. 19A, an exemplary semiconductor device is schematically illustrated. The semiconductor device comprises a semiconductor body 100 and a transistor device. The semiconductor body 100 comprises a first semiconductor layer 120. The transistor device comprises a plurality of transistor cells. For example, the transistor device may comprise a so-called superjunction device. The transistor device illustrated in FIG. 19A essentially corresponds to the transistor device that has been described with respect to FIGS. 6 and 8 above. In the example illustrated in FIGS. 19A and 19B, the transistor device is arranged in a first section of the semiconductor body 100 or first semiconductor layer 120, respectively, wherein the first section forms an active region of the semiconductor body 100 or first semiconductor layer 120. In this active region, the semiconductor device includes at least one working transistor cell with a gate electrode 33 that is dielectrically insulated from a body region 32 by a gate dielectric 34. The body region 32 is a doped semiconductor region in the active region of the semiconductor body 100. In the example illustrated in FIG. 19A, the gate electrode 33 is arranged above a first surface 101 of the semiconductor body 100.

The transistor device illustrated in FIG. 19A further includes a drift region 35. The drift region 35 adjoins the body region 32 of the at least one transistor cell and forms a pn-junction with the body region 32. The drift region 35 is arranged between the body region 32 of the at least one transistor cell and a drain region 36. The drain region 36 may adjoin the drift region 35 (as illustrated). According to another example (not illustrated) a field-stop-region of the same doping type as the drift region 35, but more highly doped than the drift region 35 is arranged between the drift region 35 and the drain region 36. Furthermore, the transistor device includes at least one compensation region 38 of a doping type complementary to the doping type of the drift region 35. According to one example, the at least one compensation region 38 adjoins the body region 32 of the at least one transistor cell. According to one example, the transistor device includes a plurality of transistor cells and each transistor cell includes a compensation region 38 adjoining the body region 32 of the respective transistor cell. In a vertical direction y of the semiconductor body 100/first semiconductor layer 120, which is a direction perpendicular to the first surface 101, the at least one compensation region 38 extends towards the drain region 36. According to one example (not illustrated), the compensation region 38 is spaced apart from the drain region 36 so that there is a section of the drift region 35 or a buffer region between the compensation region 38 and the drain region 36. Such a buffer region may be of the same doping type as the drift region 35, but more highly doped than the drift region 35, for example. According to another example, the compensation region adjoins the drain region 36 (see FIG. 19A).

The semiconductor device further comprises a sensor structure, wherein the sensor structure is formed in or on a second semiconductor layer 140. The second semiconductor layer 140 is arranged above the first semiconductor layer 120 or the drift region 35, respectively, in a vertical direction y of the semiconductor body 100 and is dielectrically insulated from the first semiconductor layer 120/drift region 35 by the gate dielectric 34. Further, an implantation zone 124, as has been explained with respect to FIG. 6 above, may be formed between the gate dielectric 34 below the second semiconductor layer 140 and the first semiconductor layer 120 or drift region 35, respectively. The second semiconductor layer 140 may be electrically coupled to the source electrode 41 by means of a fifth contact plug $42_4$ and to the sensor electrode 43 by means of a fourth contact plug 44. The second semiconductor layer 140 with the sensor structure is at least partly arranged in the active region of the semiconductor body 100.

Figure 19B:
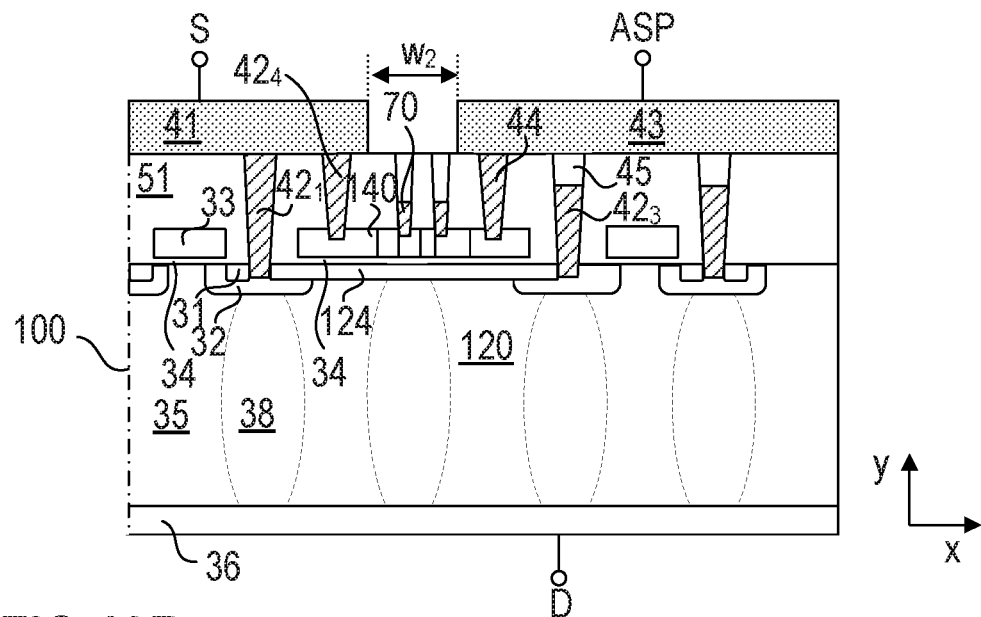

The second semiconductor layer 140 with the sensor device arranged therein or thereon may be completely arranged in the active region of the semiconductor body 100, as is illustrated in FIGS. 19A and 19B. This, however, is only an example. Alternatively, the second semiconductor layer 140 may be completely arranged on a passive region of the semiconductor body 100. According to another example, the second semiconductor layer 140 may be partly arranged on the active region and partly on the passive region. A passive region of the semiconductor body 100 may be a region that does not include all active components that are necessary to form a functioning (working) transistor cell (active components are, e.g., gate oxide, source regions 31, body regions 32, gate electrodes 33, or drain regions 36). Further, a passive region may include a field oxide instead of a gate oxide. A passive region, e.g., may be a region adjacent to the horizontal edges of the semiconductor body 100 (edge region).

Now referring to FIG. 19B, the sensor device may comprise at least one pn-junction. The at least one pn-junction is only very roughly indicated in FIG. 19B. Each pn-junction may be formed between a first junction region 143 and an adjoining second junction region 144 (first and second junction regions not explicitly illustrated in FIG. 19B). As has already been described above, the at least one pn-junction may form a series connection of at least one diode.

As has been further described above, in a chain of two or more successive pn-junctions, additional pn-junctions may be formed between the first junction region of a first pn-junction and the second junction region of an adjoining pn-junction. Such additional pn-junctions may be shunted or prevented by means of shunting elements 70, as has been described with respect to FIGS. 7 and 8 above. In FIG. 19B, shunting elements 70 are only schematically indicated. The arrangement and function of such shunting elements 70 and respective additional shunting layers (not explicitly illustrated in FIG. 19B) may be similar to the arrangement and function as has been described with respect to FIGS. 7 and 8 above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A method, comprising:
    partly removing a supporting layer arranged between a first semiconductor layer and a second semiconductor layer using an etching process, so as to form at least one undercut between the first semiconductor layer and the second semiconductor layer;
    filling the at least one undercut with a first material having a higher thermal conductivity than the supporting layer such that the at least one undercut is completely filled with the first material or such that the undercut is filled with the first material except for a cavity between the first material and a corner location of the undercut wherein the supporting layer intersects the second semiconductor layer; and
    forming a sensor device in or on the second semiconductor layer.

2. The method of claim 1, wherein at least partly filling the at least one undercut comprises:
    forming a layer of the first material on exposed surfaces of the first semiconductor layer and on exposed surfaces of the supporting layer; and
    removing the first material in areas not arranged within the at least one undercut.

3. The method of claim 1, further comprising:
    forming a trench in the second semiconductor layer which extends from a top surface of the second semiconductor layer to an opposing bottom surface of the second semiconductor layer.

4. The method of claim 3, further comprising:
    filling the trench with a second material having a thermal conductivity that is less than the thermal conductivity of the second semiconductor layer.

5. The method of claim 1, wherein forming the sensor device in the second semiconductor layer comprises:
    forming at least one pn junction within the second semiconductor layer.

6. The method of claim 1, wherein the second semiconductor layer is a protective layer during the etching process used for partly removing the supporting layer.

7. The method of claim 6, further comprising:
    before partly removing the supporting layer, forming a masking layer adjoining at least one section of the supporting layer, the masking layer configured to prevent formation of undercuts between the first semiconductor layer and the second semiconductor layer in the at least one section.

8. The method of claim 7, further comprising:
removing the masking layer after completion of the etching process for partly removing the supporting layer.

9. The method of claim 1, wherein the first material comprises polysilicon.

10. A semiconductor arrangement, comprising:
a supporting layer arranged between a first semiconductor layer and a second semiconductor layer, the supporting layer having a first thermal conductivity;
at least one first region formed of a first material, the at least one first region arranged between the first semiconductor layer and the second semiconductor layer and adjacent to the supporting layer, and the first material having a second thermal conductivity that is higher than the first thermal conductivity; and
a sensor device formed in or on the second semiconductor layer, and
wherein the at least one first region is completely filled with the first material or is filled with the first material except for a cavity between the first material and a corner location wherein the supporting layer intersects the second semiconductor layer.

11. The semiconductor arrangement of claim 10, wherein the sensor device comprises at least one pn junction.

12. The semiconductor arrangement of claim 11, wherein each of the at least one pn-junctions comprise a first junction region of a first doping type and a second junction region of a second doping type complementary to the first doping type, or each of the at least one pn-junctions comprise a first junction region of a first doping type, a second junction region of a second doping type complementary to the first doping type, and at least one third region of the same doping type as the first junction regions but more highly doped than the first junction regions, and wherein each of the at least one third region is arranged between the first junction region of a first pn-junction and the second junction region of a successive pn-junction.

13. The semiconductor arrangement of claim 12, wherein the first junction region of a first pn-junction and the second junction region of a successive pn-junction form at least one additional anti-serial pn-junction, wherein the semiconductor arrangement further comprises at least one shunting element, wherein each of the at least one shunting element is in electrical contact with the first junction region of a first pn-junction and an adjoining second junction region of a successive pn-junction, and wherein each of the at least one shunting element is configured to electrically shunt one of the additional anti-serial pn-junctions.

14. The semiconductor arrangement of claim 13, wherein the at least one shunting element comprises tungsten, a highly doped polysilicon, AlCu, or a barrier liner.

15. The semiconductor arrangement of claim 13, wherein a fourth insulation layer is arranged between the at least one shunting element and the sensor electrode to dielectrically insulate the at least one shunting element from the sensor electrode.

16. The semiconductor arrangement of claim 12, wherein a third region and the second junction region of an adjoining pn-junction form at least one additional anti-serial pn-junction, wherein the semiconductor arrangement further comprises at least one shunting element, wherein each of the at least one shunting element is in electrical contact with the third region of a first pn-junction and the second junction region of a successive pn-junction, and wherein each of the at least one shunting element is configured to electrically shunt one of the additional anti-serial pn-junctions.

17. The semiconductor arrangement of claim 16, wherein the at least one shunting element comprises tungsten, a highly doped polysilicon, AlCu, or a barrier liner.

18. The semiconductor arrangement of claim 16, wherein a fourth insulation layer is arranged between the at least one shunting element and the sensor electrode to dielectrically insulate the at least one shunting element from the sensor electrode.

19. The semiconductor arrangement of claim 10, wherein the supporting layer comprises sections that protrude from under the second semiconductor layer.

20. The semiconductor arrangement of claim 10, further comprising:
a first insulation layer arranged between the first semiconductor layer and the first material; and
a second insulation layer arranged between the second semiconductor layer and the first material.

21. The semiconductor arrangement of claim 20, wherein the second insulation layer is further arranged on surfaces of the second semiconductor material that are not covered by the supporting layer.

22. The semiconductor arrangement of claim 10, further comprising:
a transistor device comprising at least one gate electrode and a plurality of transistor cells, each of the transistor cells comprising a source region and a body region arranged in the first semiconductor layer,
wherein the body region extends from a first surface of the first semiconductor layer into the first semiconductor layer, and is dielectrically insulated from the at least one gate electrode by a gate dielectric.

23. The semiconductor arrangement of claim 22, wherein the source region and the body region of each of the transistor cells are electrically connected to a first metallization that forms a source node of the transistor device, and wherein the second semiconductor layer is electrically connected to the first metallization.

24. The semiconductor arrangement of claim 23, wherein the second semiconductor layer is further electrically connected to a second metallization that forms an active sensor pad.

25. The semiconductor arrangement of claim 24, further comprising:
a third insulation layer arranged on the first surface of the first semiconductor layer and between the second metallization and the first semiconductor layer.

26. The semiconductor arrangement of claim 25, wherein at least one of the plurality of transistor cells is arranged in a section of the first semiconductor layer arranged below the second metallization.

27. The semiconductor arrangement of claim 23, wherein the sensor device comprises at least one diode within the second semiconductor layer.

28. The semiconductor arrangement of claim 27, wherein the first metallization is electrically connected to a cathode of one of the at least one diode, and wherein the second metallization that forms a sensor pad is electrically connected to an anode of one of the at least one diode.

29. The semiconductor arrangement of claim 22, wherein the sensor device is at least partly arranged in an active area of the transistor device or is at least partly arranged in a passive area of the transistor device.

30. The semiconductor arrangement of claim 10, wherein the second semiconductor layer has a first width in a first horizontal direction of the semiconductor body and a first length in a second horizontal direction of the semiconductor body, wherein the first horizontal direction is perpendicular to the second horizontal direction, wherein the first width is between 10 μm and 200 μm, and wherein the first length is between 10 μm and 1500 μm.

31. The semiconductor arrangement of claim 10, wherein the second semiconductor layer comprises a sensor area and a remaining area, wherein the sensor device is formed at least partly in the sensor area, and wherein the semiconductor arrangement further comprises a layer of second material configured to provide thermal insulation between the sensor area and the remaining area.

32. The semiconductor arrangement of claim 10, wherein the first material comprises polysilicon.

33. A semiconductor device, comprising:
   a semiconductor body comprising a first semiconductor layer;
   a transistor device arranged in a first section of the semiconductor body which forms an active region, the transistor device comprising at least one gate electrode and a plurality of transistor cells, each of the transistor cells comprising a source region, a body region, and a compensation region formed in the first semiconductor layer, the body region extending from a first surface of the first semiconductor layer into the first semiconductor layer and being dielectrically insulated from the at least one gate electrode by a gate dielectric, the compensation region adjoining the body region and extending from the body region into the first semiconductor layer;
   a second semiconductor layer arranged on the active region and/or a passive region of the semiconductor body; and
   a sensor device formed in or on the second semiconductor layer.

34. The semiconductor device of claim 33, wherein the second semiconductor layer is dielectrically insulated from the first semiconductor layer by the gate dielectric.

35. The semiconductor device of claim 33, wherein the sensor device comprises at least one pn junction within the second semiconductor layer.

36. The semiconductor device of claim 35, wherein each of the at least one pn-junctions comprise a first junction region of a first doping type and a second junction region of a second doping type complementary to the first doping type, or each of the at least one pn-junctions comprise a first junction region of a first doping type, a second junction region of a second doping type complementary to the first doping type, and at least one third region of the same doping type as the first junction regions but more highly doped than the first junction regions, and wherein each of the at least one third region is arranged between the first junction region of a first pn-junction and the second junction region of a successive pn-junction.

37. The semiconductor device of claim 36, wherein the first junction region of a first pn-junction and the second junction region of a successive pn-junction form at least one additional anti-serial pn-junction, wherein the semiconductor device further comprises at least one shunting element, wherein each of the at least one shunting element is in electrical contact with the first junction region of a first pn-junction and an adjoining second junction region of a successive pn-junction, and wherein each of the at least one shunting element is configured to electrically shunt one of the additional anti-serial pn-junctions.

38. The semiconductor device of claim 36, wherein a third region and the second junction region of an adjoining pn-junction form at least one additional anti-serial pn-junction, wherein the semiconductor device further comprises at least one shunting element, wherein each of the at least one shunting element is in electrical contact with the third region of a first pn-junction and the second junction region of a successive pn-junction, and wherein each of the at least one shunting element is configured to electrically shunt one of the additional anti-serial pn-junctions.

* * * * *